(12) United States Patent
Jarriel et al.

(10) Patent No.: US 12,088,443 B2
(45) Date of Patent: Sep. 10, 2024

(54) SYSTEMS AND METHODS FOR PROCESSING VARIABLE CODING AND MODULATION (VCM) BASED COMMUNICATION SIGNALS USING FEEDFORWARD CARRIER AND TIMING RECOVERY

(71) Applicant: KRATOS INTEGRAL HOLDINGS, LLC, San Diego, CA (US)

(72) Inventors: Jeffrey David Jarriel, San Diego, CA (US); Daniel Joseph Sutton, San Diego, CA (US); Matthew James Stoltenberg, San Diego, CA (US); Brandon Gregory King, San Diego, CA (US)

(73) Assignee: KRATOS INTEGRAL HOLDINGS, LLC, San Diego, CA (US)

( * ) Notice: Subject to any disclaimer, the term of this patent is extended or adjusted under 35 U.S.C. 154(b) by 109 days.

(21) Appl. No.: 17/580,074

(22) Filed: Jan. 20, 2022

(65) Prior Publication Data

US 2023/0188142 A1 Jun. 15, 2023

Related U.S. Application Data

(63) Continuation of application No. PCT/US2021/062689, filed on Dec. 9, 2021.

(51) Int. Cl.
*H04L 27/227* (2006.01)
*H03L 7/22* (2006.01)

(52) U.S. Cl.
CPC ............ *H04L 27/2271* (2013.01); *H03L 7/22* (2013.01); *H04L 27/2275* (2013.01)

(58) Field of Classification Search
CPC ..... H03L 7/0808; H03L 7/22; H04L 27/2271; H04L 27/2272; H04L 27/2273; H04L 27/2275; H04L 27/2276; G06F 9/3887

(Continued)

(56) References Cited

U.S. PATENT DOCUMENTS 6,233,274 B1 * 5/2001 Tsui .................. H04L 43/00
                                            375/228
6,650,718 B1 * 11/2003 Fujimura ............ H04L 7/0334
                                            375/355

(Continued)

FOREIGN PATENT DOCUMENTS

WO 2021127006 A1 6/2021

OTHER PUBLICATIONS

Komo Ryo et al., "Wide Range Carrier Frequency Offset Estimation Method Using Training Symbols with Asymmetric Constellations for Burst-Mode Coherent Reception", 2018 Optical Fiber Communications Conference and Exposition (OFC), OSA, Mar. 11, 2018, pp. 1-3, XP033357315.

(Continued)

*Primary Examiner* — Young T. Tse
(74) *Attorney, Agent, or Firm* — Procopio, Cory, Hargreaves & Savitch LLP

(57) ABSTRACT

Processing a digital bit stream and systems for implementing the methods are provided. The method includes dividing the digital bit stream into a plurality of data packets. In a first processing block performing a carrier recovery error calculation on a first portion of the plurality of data packets, comprising preforming a first phase locked loop (PLL) function on decimated data of the data packets and performing a carrier recovery operation on the first portion of the plurality of data packets. In a second processing block, in parallel with the processing of the first portion of the plurality of packets, performing the carrier recovery error calculation on a second portion of the plurality of data packets, comprising preforming the first PLL function on decimated data of the data packets and performing the carrier recovery operation on second portion of the plurality of data packets.

23 Claims, 13 Drawing Sheets

(58) Field of Classification Search
USPC .................. 375/326, 327, 344; 329/306–308
See application file for complete search history.

(56) References Cited

U.S. PATENT DOCUMENTS

| | | | | |
|---|---|---|---|---|
| 9,407,430 | B1* | 8/2016 | Wong | H04L 7/10 |
| 2009/0190643 | A1* | 7/2009 | Kim | H04L 7/007 |
| | | | | 375/373 |
| 2011/0058595 | A1* | 3/2011 | Skeet | H04L 27/38 |
| | | | | 375/232 |
| 2012/0224657 | A1* | 9/2012 | Sasaki | H04L 27/3827 |
| | | | | 375/326 |
| 2014/0029708 | A1* | 1/2014 | Hewavithana | H03L 7/0807 |
| | | | | 375/375 |
| 2014/0226738 | A1* | 8/2014 | Plevel | H04L 25/0204 |
| | | | | 375/261 |
| 2020/0204281 | A1 | 6/2020 | King | |
| 2022/0385391 | A1* | 12/2022 | Jarriel | H04L 1/0003 |

OTHER PUBLICATIONS

International Search Report and Written Opinion dated Jul. 2, 2022 for International Patent Application No. PCT/US2021/062689.

* cited by examiner

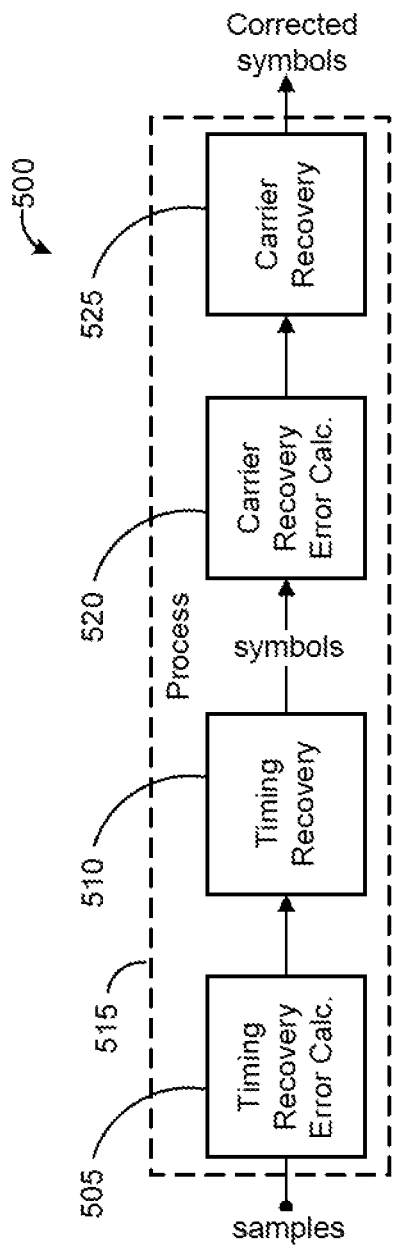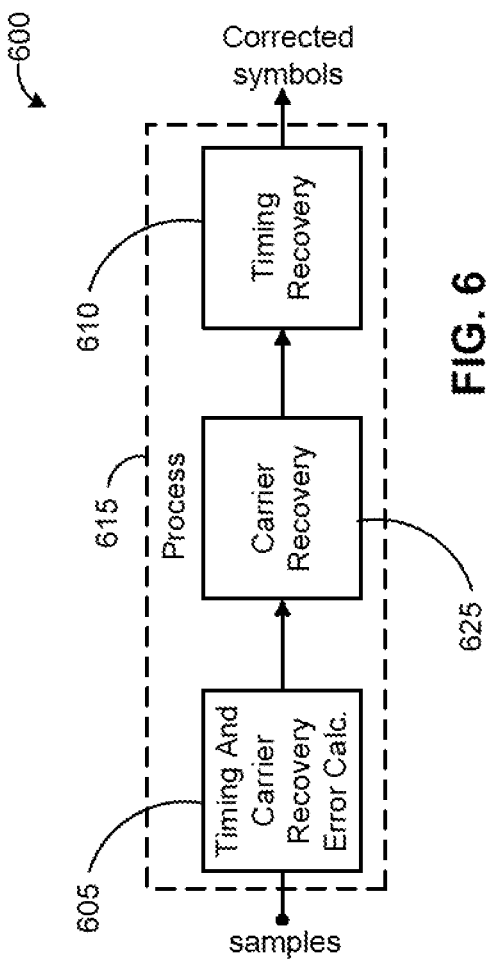

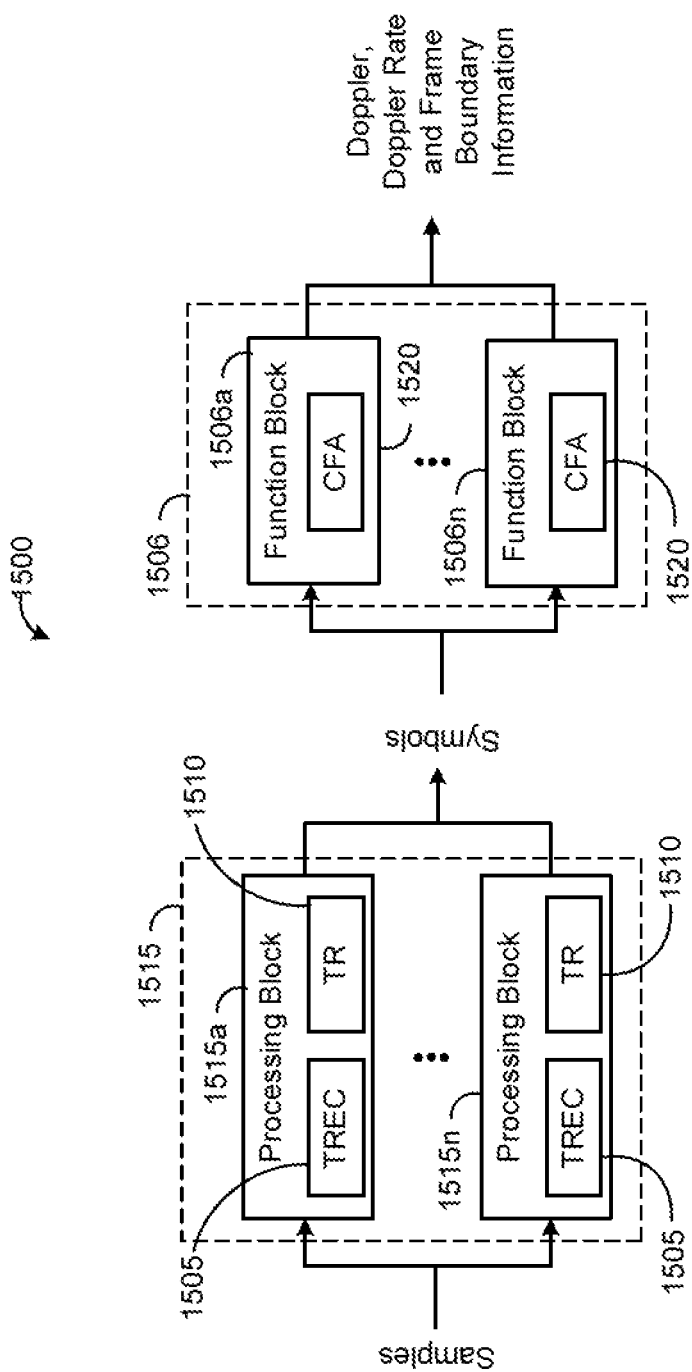

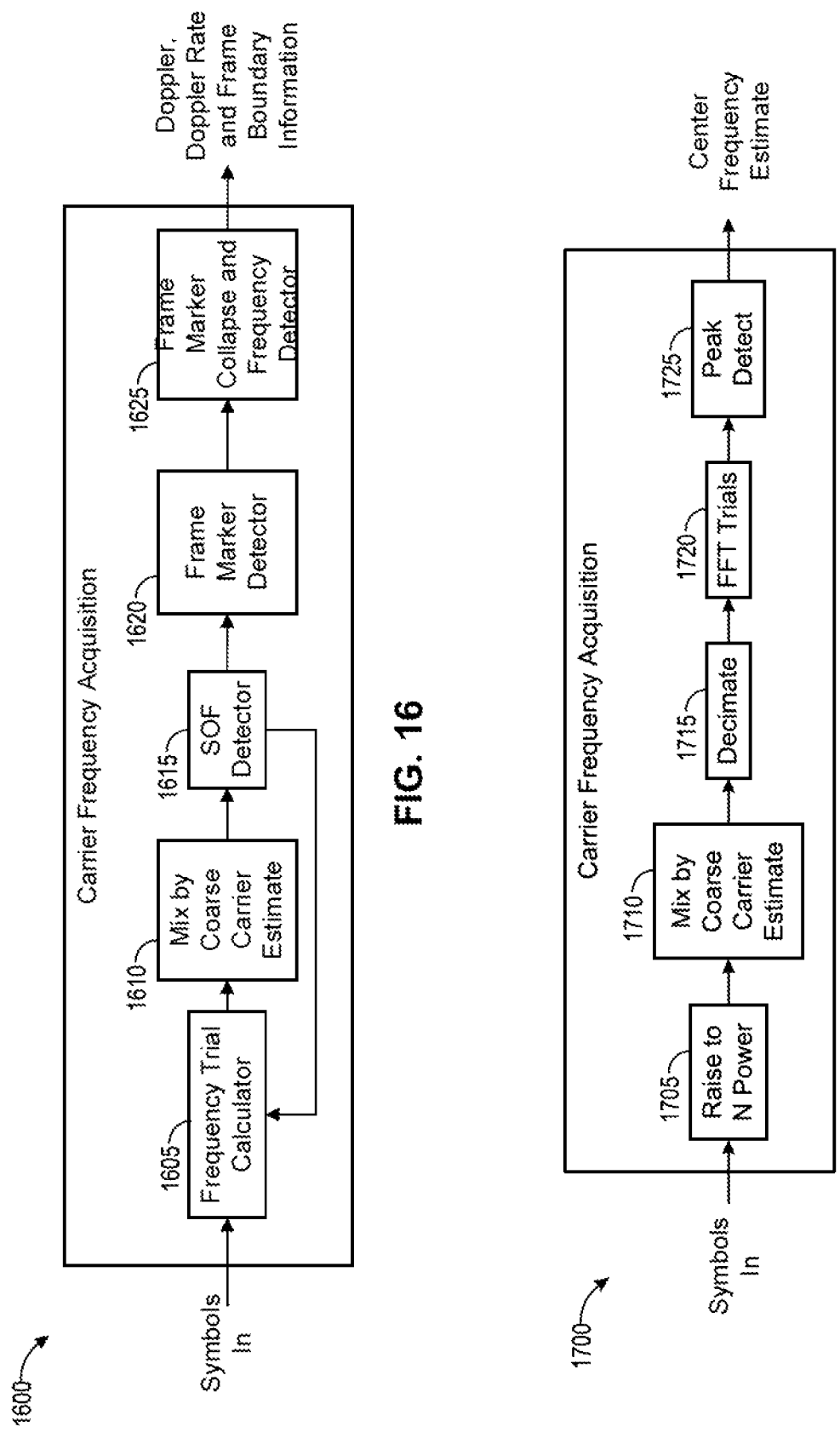

SYSTEMS AND METHODS FOR PROCESSING VARIABLE CODING AND MODULATION (VCM) BASED COMMUNICATION SIGNALS USING FEEDFORWARD CARRIER AND TIMING RECOVERY

RELATED APPLICATIONS

This application is a continuation of PCT/US2021/062689, filed on Dec. 9, 2021, the disclosure of which is incorporated by reference in its entirety herein.

BACKGROUND

Technical Field

This disclosure relates to signal processing. More specifically, this disclosure relates to implementing distributed computing using a general-purpose processor (GPP) to achieve high-rate processing.

Description of the Related Art

In some examples, a satellite communication signal can require large ground stations and other facilities to transmit and/or receive and process data locally. This can include extensive antenna arrays, associated radio frequency terminals (RFTs), and significant electronics (modems, signal processors, etc.) to receive, process, and use the data received from an associated satellite.

SUMMARY

The following summary is not intended to define every aspect of the invention, and other features and advantages of the present disclosure will become apparent from the following detailed description, including the drawings. The present disclosure is intended to be related as a unified document, and it should be understood that all combinations of features described herein are contemplated, even if the combination of features are not found together in the same sentence, paragraph, or section of this disclosure. In addition, the disclosure includes, as an additional aspect, all embodiments of the invention narrower in scope in any way than the variations specifically mentioned herein.

This disclosure addresses systems and methods for satellite communications using downlink site diversity and uplink transmit power management. A plurality of ground stations can include a piggyback signal in transmissions to ensure coherent reception of multiple versions of a signal using site diversity.

As disclosed herein, digital signal processing (DSP) can be performed in many different ways using general purpose processors, or central processing units (CPUs). Example techniques executed on a general-purpose processor to achieve high rate processing that can perform the disclosed functions include, but are not limited to:
- using multiple CPUs and the parallel processing on the many cores of each CPU;
- employing single instruction, multiple data (SIMD) techniques;
- feed-forward processing to break up feed-back loops;
- pre-calculation of metadata (or state information) to divide the heavy processing over several CPUs; and
- collection of multiple functions into a single function in a manner that increases CPU performance or lowers memory bandwidth utilization.

One way to increase through-put on a general-purpose CPU is to utilize as many cores as possible that exist on the CPU. Great care must be taken to ensure data is properly shared amongst several cores within the CPU but this allows for processing throughput to increase with the addition of more CPU cores. It is also possible to use several CPUs on the same system, with each CPU containing multiple cores. All embodiments within this disclosure take advantage of using multiple cores within a CPU, and some embodiments take advantage of having multiple CPUs per system and/or even groups of systems in a server environment.

Another way to achieve high processing rates is to take advantage of single instruction, multiple data (SIMD) capabilities of general-purpose CPUs. This allows a single CPU core to perform up to 16 floating point operations on a single instruction, as is the case of AVX512 SIMD operations. One example of employing SIMD is using a finite impulse response (FIR) filter function in which 16 floating point results are calculated at once. Another example is when multiplying complex numbers together. Instead of calculating one pair of quadrature signals (IQ data), it is possible with AVX512 to calculate eight IQ pairs at a time. Complex multiplication is used in nearly every processing algorithm described in this disclosure.

Some processing systems implement various forms of feedback, often including a phase lock loop (PLL) or a delay lock loop (DLL). However, feedback in general prior to decimation, as is the case for conventional PLLs and DLLs can be problematic because the very nature of the feedback causes bottlenecking. The feedback loop forces all the incoming data to be processed on a single (e.g., linear) process that cannot not be easily split or otherwise divided. In addition to the feedback, there are other obstacles to overcome using PLLs and DLLs including how often to calculate the error term. The feedback loop can be replaced with a feed-forward loop in which error states can be processed on a block of data and then the calculated error term is fed-forward to another block which applies the error term. In some implementations, if proper overlap is used, the error calculation and application of that term can be split over several CPU cores to further increase through-put.

In addition to feed-forward approach to processing data, it can be beneficial to perform pre-calculation of metadata in a single block that then splits up the processing of the data over several CPU cores. This method is similar to the feed-forward methodology already discussed, but in this case, it is not breaking up a loop (such as feed-back loop) but simply leveraging many CPU cores to increase the amount of data that can be processed. In this way the block that performs the pre-calculation does not perform the CPU intensive processing but calculates the needed steps such as iterations within a for-loop and start indices and slope points between interpolation phases values.

Another technique that can be employed on general purpose CPUs to achieve high through-put is the way the set of functions is employed and memory type used. In some cases, memory bandwidth becomes the limiting factor in performance. If this is the case, the goal is to limit the amount of data that needs to transferred to and from random-access memory (RAM) (not faster memory like CPU cache). In order to do this, functions need to be collapsed so that they all run together instead of individually with goal of accessing slower RAM as little as possible as compared to accessing faster CPU cache. Another method to lowering memory bandwidth is utilizing properly spaced memory types, e.g., using int8 when possible versus floats or doubles.

In an embodiment, methods for processing a digital bit stream and systems for implementing the methods are provided, wherein the digital bit stream is a digitized communication signal. The method includes dividing, at one or more processors, the digital bit stream into a plurality of data packets; in a first processing block, of a plurality of processing blocks, in the one or more processors, performing a carrier recovery error calculation on a first portion of the plurality of data packets, comprising preforming a first phase locked loop (PLL) function on decimated data of the first portion of the plurality of data packets and performing a carrier recovery operation on the first portion of the plurality of data packets; in a second processing block, of the plurality of processing blocks, in the one or more processors, in parallel with the processing of the first portion of the plurality of packets, performing the carrier recovery error calculation on a second portion of the plurality of data packets, comprising preforming the first (PLL) function on decimated data of the second portion of the plurality of data packets and performing the carrier recovery operation on second portion of the plurality of data packets; and combining the first portion and the second portion based on phase stitching.

In a further aspect, the method includes in a third processing block in the one or more processors, performing a timing recovery error calculation on the first portion of the plurality of data packets, and performing a timing recovery operation on the first portion of the plurality of data packets; and in a fourth processing block in the one or more processors, in parallel with the processing of the third portion of the plurality of packets, performing the timing recovery error calculation on the second portion of the plurality of data packets, and performing the timing recovery operation on second portion of the plurality of data packets.

In a further aspect, the timing recovery error calculation comprises preforming a second PLL function on decimated data of the first and second portions of the plurality of data packets.

In a further aspect, the timing recovery error calculation comprises: receiving data packets as samples of the downlink signal, the samples having an unknown symbol rate and frequency; determining a timing error of the samples based on an estimate of the symbol rate; decimating the samples by a decimation filter; executing the second PLL function on the decimated symbols to determine a phase, frequency, and Doppler rate of the symbols; and updating the estimate of the symbol rate.

In a further aspect, the PLL function is one of a second order PLL, a third order PLL, a reversable PLL, and a reversable, iterative PLL. And in a further aspect, each of the data packets of the plurality of data packets includes an overlap of data from an adjacent packet, and wherein the PLL function is a second order PLL. And in a further aspect, each of the data packets are framed data packets, and wherein the PLL function is one of a reversable PLL and a reversable, iterative PLL.

In a further aspect, the method further includes locating frame boundaries of each framed data packet by detecting a frame marker, wherein performing the carrier recovery error calculation on the first and second portions of the plurality of data packets is based on the located frame boundaries. And in a further aspect, the method includes: in a third processing block in the one or more processors, performing a timing recovery error calculation on the first portion of the plurality of data packets, and performing a timing recovery operation on the first portion of the plurality of data packets; in a fourth processing block in the one or more processors, in parallel with the processing of the third portion of the plurality of packets, performing the timing recovery error calculation on the second portion of the plurality of data packets, and performing the timing recovery operation on second portion of the plurality of data packets; and wherein locating the frame boundaries is performed on the combined first and second portions.

In a further aspect, the plurality of processing blocks comprises a plurality of central processing unit (CPU) cores.

In a further aspect, the carrier recovery error calculation comprises: receiving the symbols associated with the synchronized samples of the downlink signal; determining a carrier error of the symbols based on an estimate of a frequency of the downlink signal and a product of the symbols raised to a power of n, wherein n is an integer; decimating the symbols by a decimation filter; and executing the first PLL function on the decimated symbols to determine a phase, frequency, and Doppler rate of the symbols; and updating the estimate of the frequency.

In a further aspect, the one or more processors employ single instructions, multiple data (SIMD) techniques to achieve high throughput.

In a further aspect, a system for processing a digital bit stream representative of a communication signal is provided. The system comprises: a digitizer configured to convert a received analog signal into the digital bitstream; and one or more processors communicatively coupled to the digitizer, the one or more processors having a plurality of processing blocks and operable to perform the method of any one of the preceding methods.

In a further aspect, a non-transitory computer-readable medium for processing a digital bit stream of a satellite downlink signal comprising instructions that when executed by one or more processors, cause the one or more processors to perform the method of any one of the preceding methods is provided.

BRIEF DESCRIPTION OF THE DRAWINGS

The details of the present invention, both as to its structure and operation, may be gleaned in part by study of the accompanying drawings, in which like reference numerals refer to like parts, and in which:

FIG. 5 is a functional block diagram of an example system and method for signal processing of a received downlink signal, in accordance with embodiments disclosed herein.

FIG. 6 is a functional block diagram of another example system and method for signal processing of a received downlink signal, in accordance with embodiments disclosed herein.

FIG. 15 is a functional block diagram of an embodiment of a system and method for carrier and frame acquisition of a received downlink signal, in accordance with embodiments disclosed herein.

FIG. 16 is a functional block diagram of an embodiment of a system and method for carrier frequency acquisition, in accordance with embodiments disclosed herein.

FIG. 17 is a functional block diagram of an embodiment of a system and method for carrier frequency acquisition, in accordance with embodiments disclosed herein.

DETAILED DESCRIPTION

Figure 1:
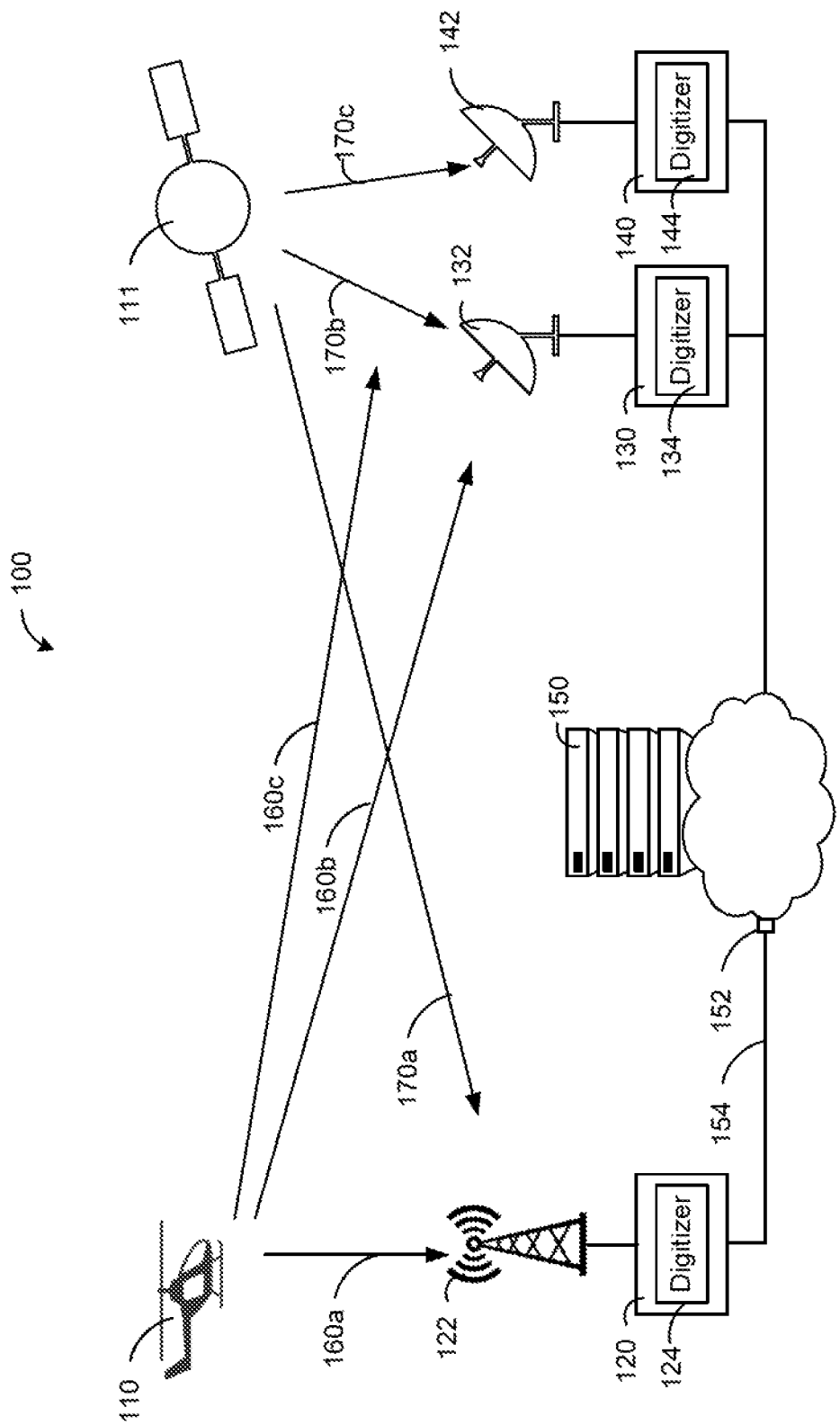
FIG. 1 is a graphical representation of an example of a communication system, in accordance with the embodiments disclosed herein.

Embodiments of an improved communication system using a general-purpose processor to achieve high-rate processing are disclosed. Embodiments disclosed herein provide for improved communication systems capable of utilizing a general-purpose processor to efficiently achieve a high-rate of signal processing. After reading this description, it will become apparent to one skilled in the art how to implement the invention in various alternative embodiments and alternative applications. However, although various embodiments of the present invention will be described herein, it is understood that these embodiments are presented by way of example and illustration only, and not limitation. As such, this detailed description of various embodiments should not be construed to limit the scope or breadth of the present invention as set forth in the appended claims.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

A communication system is used as a primary example throughout the description, however, the application of the disclosed methods is not so limited. For example, any wireless or radio communication system requiring the use of digital signal processing, a modem, etc., can implement the systems, methods, and computer readable media described herein.

This disclosure provides systems and methods for performing Digital Signal Processing using general purpose central processing units (CPUs) in either a standard server environment or a virtualized cloud environment. In some examples, the systems can employ single-instruction multiple data (SIMD) techniques to achieve high throughput including SSE, SSE2, SSE3, SSE4.1, SSE4.2, AVX, AVX2 and AVX512 instruction sets. This disclosure describes how the data processing is managed over multiple processing cores of the processors (e.g., CPUs) to achieve the necessary throughput without the use of dedicated signal processing hardware such as Field Programmable Gate Arrays (FPGAs) or High Performance Computing (HPC) hardware such as Graphics Processing Units (GPUs). The ability to perform this processing in general-purpose server CPUs, including but not limited to x86 architecture made by Intel and AMD micro-processors, as well as ARM processors like Cortex-A76, NEON and AWS Graviton and Graviton2, allows the functions to be deployed within a general-purpose cloud processing environment using a virtualized processing architecture without the need for dedicated hardware. The processing in general purpose CPUs is enabled by a Digital IF appliance that samples the analog signal and feeds the digitized samples into the CPU over an Ethernet connection. The Digital IF appliance can also accept digitized samples and covert to an analog signal, similar to that described in U.S. Pat. No. 9,577,936, issued Feb. 21, 2017, entitled "Packetized Radio Frequency Transport System" the contents of which are incorporated by reference in their entirety.

U.S. Pat. No. 10,790,920, the disclosure of which is incorporated herein by reference in its entirety, provides methods and systems for demodulating digitized downlink signals to achieve high-rate processing. For example, U.S. Pat. No. 10,790,920 provides timing and carrier recovery processes performed on overlapping portions of adjacent blocks of data to synchronize a digitized downlink signal. To perform carrier recovery or timing recovery using feedforward signal processing, for example, as described in connection with FIGS. 3 and 4 below, blocks of data must be processed to obtain the appropriate phase information. For timing recovery, the information that is obtained is timing phase information and for carrier recovery, the information that is carrier phase information. There are several approaches to deriving phase information. For example, as discussed in U.S. Pat. No. 10,790,920, a signal may be fed into a phase detector, then filtered and decimated, and then run into a curve fit filter calculator. This approach works well for stable signals. However, real world implementations of downlink signals can have inconsistencies that cause phase jumps, which may prove problematic to the curve fit filter calculator. For example, the phase of the carrier and timing of downlink signals can jump quickly due imperfections in the transmitter, or any number of reasons, such that that a curve fit filter may be insufficient to use for tracking. That is, the curve fit (e.g., a linear, quadratic, parabolic or any other algebraic equation) may not be determined that is able to account for such phase jumps.

Accordingly, embodiments described herein provide methods and systems configured to demodulate digitized downlink signals to achieve high-rate processing that can handle phase jumps, phase noise and/or inconsistencies in the downlink signals. For example, embodiments disclosed herein execute a phase lock loop (PLL) function on decimated data. As used herein, "PLL function" may refer to any type of PLL, for example, a second order PLL, a third order PLL, or any PLL function known in the art. Other example PLLs include, but are not limited to, a reversable PLL (RPLL) and a reversable, iterative PLL (RIPLL), both of which are described below in connection with FIG. 11.

Executing a PLL function on decimated data may provide several benefits, such as but not limited to, behaving similar to a standard feed-back receiver that employs a PLL, which is a common receiver implementation and is beneficial to maintain consistency with that approach, and capable of handling quick, unpredictable phase jumps or phase noise that a curve fit filter simply cannot handle.

When estimating phases of carrier and timing of downlink signals, three components may need to be calculated for each block of data on the downlink to be processed. For example, an average start phase, average frequency (also referred to as Doppler), and average rate of change of frequency (also referred to as Doppler Rate) may need to be calculated. Estimation of each component may be possible prior to processing, for example, via one or more carrier and frame acquisition techniques, as discussed below in connection to FIG. 15 n. In some implementations, it may be adequate to assume the Doppler and Doppler Rate are well known such that the PLL will not cycle slip when execute.

One downside to using a PLL for estimating phase is the initial loop response that occurs when the PLL starts (for example, but not limited to, impulse response, step response, ramp response, etc.), which is common to all feed-back loops. Embodiments herein provide systems and methods for accounting for the initial loop response or otherwise removing the loop response drawback from the process.

One approach to solving the loop response of the PLL is to process blocks of samples back-to-back. However, this cannot scale to be run on several processors at the same time, because the PLL is a state machine and a subsequent block of samples cannot run until a current block of sample is processed, and is therefore rate limited. Preferably, each block of samples on the downlink is processed independently and therefore can be run on as many processors as needed, without regard to adjacent data blocks, to achieve the desired throughput.

Another approach to solving the initial loop response is to utilize overlapping portions between adjacent blocks of data to ensure the PLL is stable by the time non-overlapped data is processed. In this approach, overlapping data from a processed block of data may be used to synchronize an adjacent block of data that is subsequently processed while the loop response of the PLL settles. This can be an effective method and can be computationally efficient if the mount of overlapping data is small relative to the overall size of the block of data to be processed. Various embodiments disclosed herein utilize a second order PLL with the overlapping data approach, whoever implementations herein may be used with any PLL function, for example but not limited to, a third order PLL, RPLL, RIPLL, or any other PLLs known in the art. However, as the size of blocks of data decreases, the percentage of overlapping data to non-overlapping data increases, and the time of loop response of the PLL does not change in time with a fixed loop-bandwidth. The increased percentage may have a deleterious effect on CPU performance since the overlapped data must be processed at the sample or symbol rate before decimation. According to some embodiments disclosed herein, the overlap percentage can be reduced and even eliminated, for example, by using a reversable PLL (RPLL) and/or reversable, iterative PLL (RIPLL), discussed below in greater detail.

In certain cases, overlapping blocks of data may not be feasible. For example, certain types of waveforms make overlapping data prohibitive. Examples of such waveforms include, but are not limited to, burst waveforms and framed waveforms. In the case of burst waveforms, signals, each containing a block or burst of data packets, come and go and overlap of data might not be an option. An example of a burst waveform is Time-Division Multiple Access (TMDA). In TDMA, many users share the same frequency and are assigned time slots in which to transmit. In the case of burst waveforms like TDMA, every time a user transmits, acquisition starts from scratch and is desirable to recover all data transmitted, even data at the start. In some cases, there is preamble that allows time for the receiver to lock but this is not always the case. In those cases, the loop response must be accounted for. TMDA is one example, any burst waveform may be used in accordance with the embodiments disclosed herein. In the case of framed waveforms, such as, but not limited to, DVB-S2, DVB-S2x, certain CCSDS waveforms employing LDPC or Reed-Solomon forward-error-correction (FEC) or any other types of framed waveforms comprise framed data packets, which can pose problems for utilizing overlapped data for synchronization. For example, certain framed waveforms may change modulation and coding type at frame boundaries on a frame-by-frame basis, thus inhibiting synchronization via overlapping portions. Thus, it may be beneficial to recover carrier information for each frame independently without the use of overlapping portions. Collectively burst and framed waveforms will be referred to herein as framed waveforms and the blocks of data comprised thereby will be referred to as blocks of framed data packets; framed data packets; or framed data. Each block of framed data may be referred to as a frame of data.

Before carrier recovery of a block of framed data is possible, frame boundaries of the frame of data may have to be located. A frame boundary for each frame can be located by detecting a known pattern (herein referred to a frame marker) placed at the start of the frame of data. In the case of framed waveforms, the frame marker may be an Attached Sync Marker (ASM). In the case of DVB-S2 and DVB-S2x, the frame marker may be a PLHEADER and the frame boundaries can be found by detecting the PLHEADER for each frame of data.

Once frames boundaries have been located, the phase can be computed using a phase detector. Each frame of data can have a different modulation type and the phase detector should be able to accommodate all possible modulation types. For example, in the case of a QPSK waveform, the signal is raised to the 4th power which collapses the 4 IQ constellation dots into 1 dot. The phase is then computed by taking the arctangent of the signal. There are many approaches to calculating phase, as is known in the art. In the case of DVB-S2, the modulation types include QPSK, 8PSK, 16APSK and 32APSK and frames are called PLFRAMES, which can vary in size. For a generic case, any modulation type can be used as well as fixed or variable sized frames. In embodiments that utilize overlapping data, the modulation type is assumed to be a fixed modulation type common to each block of data. Therefore, embodiments utilizing overlapping need not change phase detectors between adjacent blocks of data. In these cases, overlapping data is a viable option for synchronizing processed blocks of data. However, in the case of framed data, changes in modulation type requires different phase detectors.

FIG. 1 is a graphical representation of an embodiment of a communication system. A communication system (system) 100 can have a platform 110 and a satellite 111 that communicate with a plurality of ground stations. The platform 110 can be an aircraft (e.g., an airplane, helicopter, or unmanned aerial vehicle (UAV), missile, boat, etc.). A plurality of ground stations 120, 130, 140 can be associated with a terrestrial radiofrequency (RF) antenna 122 or one or more satellite antennas 132, 142. The ground station 120 can have an antenna 122 coupled to a digitizer 124. The digitizer 124 can have one or more analog to digital converters (A2D) for converting analog signals received at the antenna 122 into a digital bit stream for transmission via a network. The digitizer 124 can also include corresponding digital to analog converters (D2A) for operations on the uplink to the platform 110 and the satellite 111.

Similarly, the ground station 130 can have an antenna 132 and a digitizer 134, and the ground station 140 can have an antenna 142 and a digitizer 144.

The ground stations 120, 130, 140 can each receive downlink signals 160 (labeled 160a, 160b, 160c) from the platform 110 and the downlink signals 170 (labeled 170a, 170b, 170c) from the satellite 111 in a receive chain. The ground stations 120, 130, 140 can also transmit uplink signals via the respective antennas 122, 132, 142 in a transmit chain. The digitizers 124, 134, 144 can digitize the received downlink signals 160, 170 for transmission as a digital bit stream 154. The digital bit stream 154 can then be transmitted, via a network 152 to a cloud processing system. The digital bit stream 154 may be transmitted to the cloud processing system as packets that are collected at the cloud processing system into blocks of data packet for processing.

In some examples, the ground stations 120, 130, 140 can process all of the data (e.g., contained in the downlink signals) locally, however this can be exceptionally expensive from a time, resource, and efficiency perspective. Therefore, in some embodiments, the downlink signals can be digitized and transmitted as the digital bit stream 154 to a remote signal processing server (SPS) 150. In some implementations, the SPS 150 can be positioned in a physical location, such as a data center located in an offsite facility that is accessible via a wide area network (WAN). Such a WAN can be the Internet, for example. The SPS 150 can demodulate the downlink signals from the digital bit stream 154 and output the data or information bits from the downlink signals. In some other implementations, the SPS 150 can use cloud computing or cloud processing to perform the signal processing and other methods described herein. The SPS 150 can also be referred to as a cloud server.

The SPS 150 can then provide the processed data to the user or send to a different site. The data and information can be mission-dependent. In addition, the information contained in the data can be the main purpose of the satellite, including weather data, image data, and satellite communication (SATCOM) payload data. As noted above, SATCOM is used as a primary example herein, but any communication or signal processing system using DSP can implement the methods described herein.

In order to achieve high processing rates with software, a conventional phase lock loop (PLL) or delay lock loop (DLL) approach, prior to decimation, can be problematic due to the feedback within the loop. The feedback loop forces all of the incoming data (e.g., the downlink signal 160 and/or 170) to be processed on a single (e.g., linear) process that cannot be easily split or otherwise divided. In addition to the feedback, there are other obstacles to overcome using the PLL/DLL including, for example, how often to calculate the error term.

Figure 2:
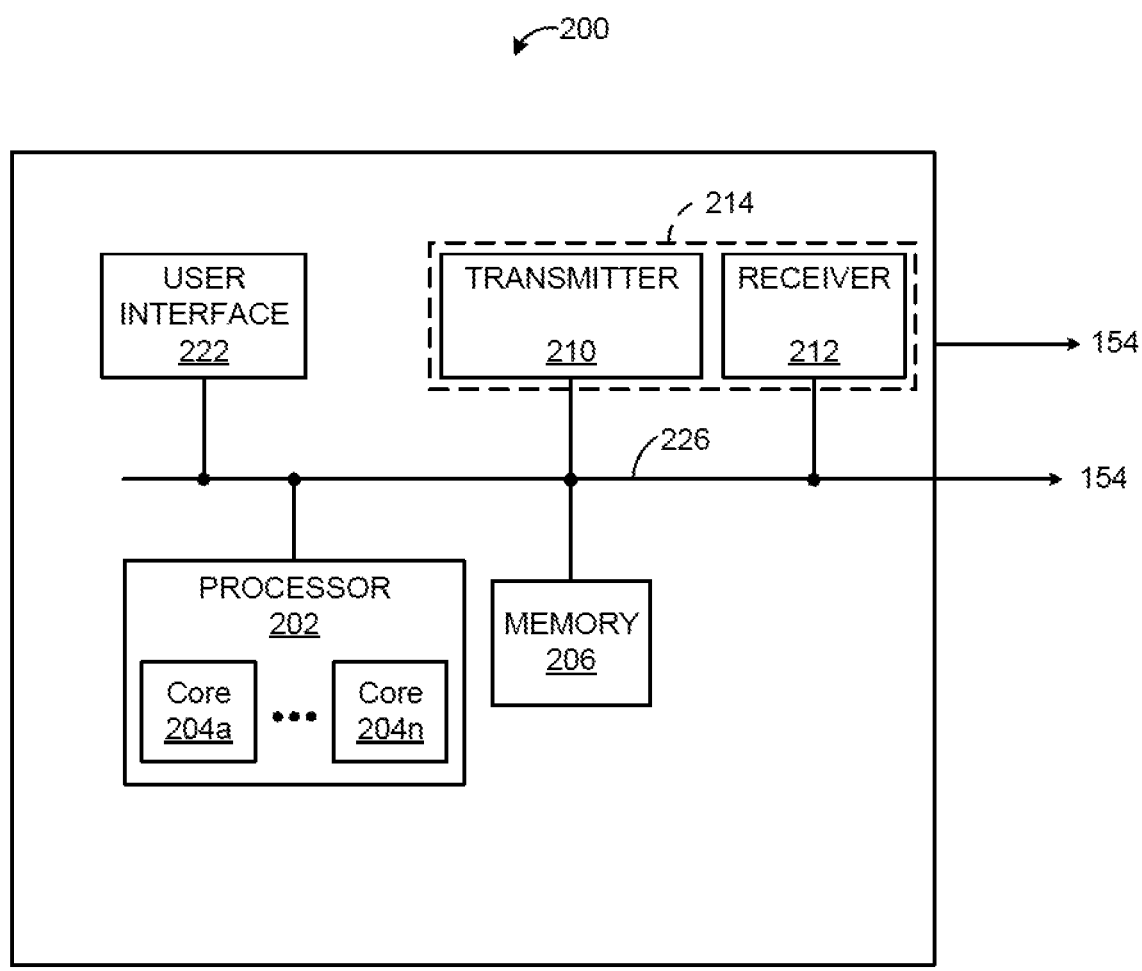
FIG. 2 is a functional block diagram of a wired or wireless communication device for use as one or more components of the system of FIG. 1.

FIG. 2 is a functional block diagram of a wired or wireless communication device for use as one or more components of the system of FIG. 1. A processing device (device) 200 may be implemented as, for example, the SPS 150 of FIG. 1. The device 200 can be implemented as needed to perform one or more of the signal processing methods or steps disclosed herein.

The device 200 may include a processor 202 which controls operation of the device 200. The processor 202 may also be referred to as a CPU. The processor 202 can direct and/or perform the functions, for example, attributed to SPS 150. Certain aspects of the device 200, including the processor 202, can be implemented as various cloud-based elements, such as cloud-based processing. Accordingly, the processor 202 can represent cloud processing, distributed over several disparate processors via a network (e.g., the Internet). Alternatively, certain components can be implemented in hardware. The processor 202 may be implemented with any combination of one or more of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

The processor 202 can have one or more cores 204 (shown as core 204a through core 204n) on which computations can be performed. In implementations using cloud processing, the cores 204 can represent multiple iterations of distributed cloud processing. In some embodiments, using hardware, the processor 202 can be a complex, integrated circuit on which all the computations for the receiver are taking place. As used herein, the cores 204 can each be one processing element of the processor 202. The processor 202 can implement multiple cores 204 to perform the necessary parallel processing for the methods disclosed herein. In some embodiments, the processor 202 may be distributed across multiple CPUs as in cloud computing.

The device 200 may further include a memory 206 operably coupled to the processor 202. The memory 206 can be cloud-based storage or local hardware storage. The memory 206 can include both read-only memory (ROM) and random access memory (RAM), providing instructions and data to the processor 202. A portion of the memory 206 may also include non-volatile random access memory (NVRAM). The processor 202 typically performs logical and arithmetic operations based on program instructions stored within the memory 206. The instructions in the memory 206 may be executable to implement the methods described herein. The memory 206 can further include removable media or multiple distributed databases.

The memory 206 may also include machine-readable media for storing software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the processor 202 or the one or more cores 204, cause the device 200 (e.g., the SPS 150) to perform the various functions described herein.

The device 200 may also include a transmitter 210 and a receiver 212 to allow transmission and reception of data between the communication device 200 and a remote location. Such communication can occur between the ground station 120 and the SPS 150 via the network 152, for example. Such communications can be wireless or conducted via wireline communications. The transmitter 210 and receiver 212 may be combined into a transceiver 214. The transceiver 214 can be communicatively coupled to the network 152. In some examples the transceiver 214 can include or be a portion of a network interface card (NIC).

The device 200 may further comprise a user interface 222. The user interface 222 may comprise a keypad, a microphone, a speaker, and/or a display. The user interface 222 may include any element or component that conveys information to a user of the device 200 and/or receives input from the user.

The various components of the device 200 described herein may be coupled together by a bus system 226. The bus system 226 may include a data bus, for example, as well as a power bus, a control signal bus, and a status signal bus in addition to the data bus. In some embodiments, the bus system 226 can be communicatively coupled to the network 152. The network 152 can provide a communication link between the device 200 (e.g., the processor 202) and the ground station 120, for example. Those of skill in the art will appreciate the components of the device 200 may be coupled together or accept or provide inputs to each other using some other mechanism such as a local- or wide area network for distributed processing.

Figure 3:
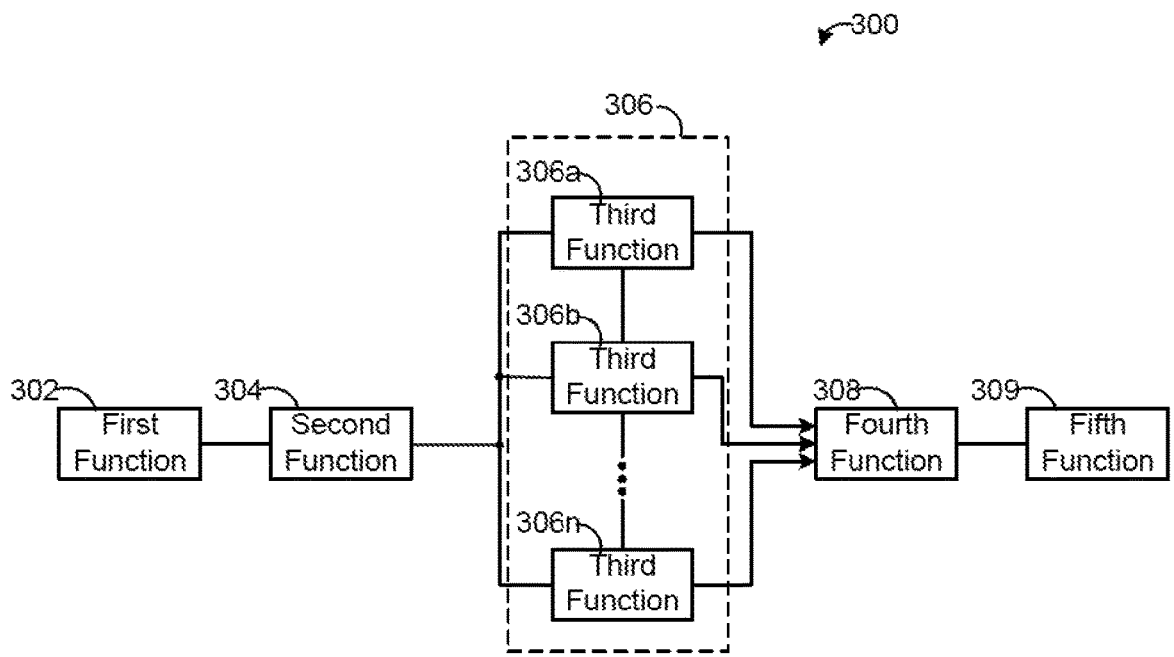
FIG. 3 is a graphical depiction of an example of feedforward or pre-calculation signal processing, in accordance with embodiments disclosed herein.

FIG. 3 is a graphical depiction of schematic block diagram of an embodiment of feedforward or pre-calculation signal processing 300. A method 300 can occur as a generalized process incorporating a plurality of functions by, for example, the processor 202. The processor 202 can perform the plurality of functions in a series or in parallel arrangement as shown to perform one or more desired processes. Each function may refer to a block or collection of instructions or software executable by the processor 202 and stored in a memory 206.

A first function 302 can be performed by the processor 202. In some embodiments, a second function 304 can be performed serially, following the first function 302. Accordingly, the processor 202 can split blocks of data with the different functionality for processing over multiple cores 204 to perform the first function 302 and the second function 304.

The processor 202 can perform distributed processing of a third function 306 (shown as 306a, 306b, . . . 306n) in parallel, following the second function 304. To indicate that various number of functions 306a-306n may operate in parallel, three paths are depicted with three vertical dots between them indicating that any number of paths can be included, such as, but not limited to, four, five, six, etc. The parallel processing of the third function 306 can include, for example, splitting blocks of data associated with the same functionality over several cores 204 (e.g., processing blocks) of the processor 202. For example, "blocks of data" can mean a group of samples that need to be processed.

The term "parallel" is used herein to describe that processing occurs in the blocks 306a-306n at the same time. The packets being processed may be of different lengths from one block 306a-306n to another, so the processing of packets may have the same rate or speed from one block 306a-306n to the next. As noted below, some of the bocks 306a-306n may proceed faster or slower than others. Accordingly, the term parallel should not be limited to simultaneous or concurrent processing within the blocks 306a-306n.

The processor 202 can then perform a fourth function 308, and a fifth function 309 in series. Similar to the first function 302 and the second function 304, the serial performance of the fourth function 308 and the fifth function 309 can include splitting blocks of data associated with the different functionality for processing over multiple cores 204. In general, each of the first function 302, the second function 304, the third function 306, the fourth function 308, and the fifth function 309 can each be performed in a different processing block. As used herein, a processing block can refer to a specific task performed on a block of data. The processing block can be associated with one or more of the cores 204, for example.

Therefore, the method 300 can split blocks of data with the same functionality to process over multiple cores 204, for example. Similarly, the method 300 can split blocks of data with different functionality to process over multiple cores 204.

In some other implementations of the method 300, the same processing blocks (e.g., the cores 204) can perform processing of data with single instruction, multiple data (SIMD), irrespective of the same or different functionality.

In some implementations, the embodiments of the method 300 can support processing blocks of data with minimal state information by using overlapping data. As used herein, state information can include variables needed during feedback (e.g., feedback processing), data frame boundaries, etc. For example, in the case of feedback loops, state information can include the variables calculated within the loop that are needed during feedback in processing a continuous stream of data. State information can also include the location of a frame boundary within a data stream. Other examples can include things such as FIR filters where the state information includes values stored in buffers (e.g., possibly many delay elements) that are needed to keep continuous data flowing.

By ignoring state information and overlapping portions of adjacent blocks of data, processes can take advantage of parallel processing, using a variable level of overlap amongst the blocks of data.

In other implementations, the embodiments of the method 300 can support processing framed data. For example, certain framed waveforms may change modulation and coding type on frame boundaries, thus inhibiting synchronization. Thus, it may be beneficial to recover carrier information for each frame independently without the use of overlapping portions. By ignoring overlapping portions of adjacent blocks of data, processes can take advantage of parallel processing by recovering carrier information for each frame of data independent of other frames of data. Independent processing of frames of data back-to-back may be utilized to fix a loop response of a PLL.

Figure 4:
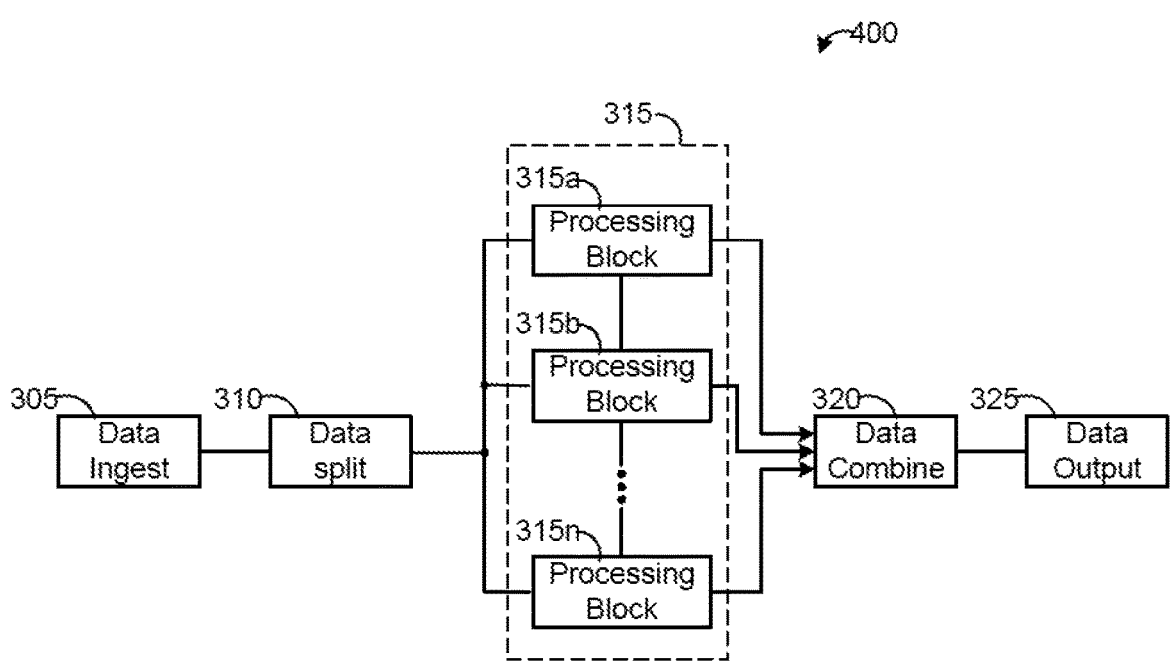
FIG. 4 is a graphical depiction of another example of feedforward or pre-calculation signal processing of FIG. 3, in accordance with embodiments disclosed herein.

FIG. 4 is a graphical depiction of an embodiment of a method for feedforward or pre-calculation signal processing of FIG. 3. A method 400 can use the principles of the method 300 for series-parallel and/or parallel-series processing for multiple functions grouped as a process 315. In one example, the first function 302 (FIG. 3) can be a data ingest function 305, in which the processor 202 receives data for processing. The second function 304 (FIG. 3) can be a data split function 310, in which the processor 202 can parse data in blocks of data.

In some embodiments, the data split function 310 parses data into overlapping blocks of data. The overlapped blocks of data can then be processed in parallel in various, parallel iterations of multiple functions as processing blocks 315a-315n. For example, a first block of data can be processed by a group of functions in processing block 315a, and another block of data can be processed by the group of functions in another processing block 315b-315n executed in parallel with the processing block 315a. A plurality of processing blocks 315a-315n may be executed in parallel, and is not limited to two such processing blocks. The overlap in the blocks of data can provide a level of redundancy that is not heavily reliant (or not reliant at all) on state information. The less state information that is needed, the easier it is to process the blocks of data in parallel as opposed to a continuous stream. To indicate that various number of processing blocks 315a-315n may operate in parallel, three paths are depicted with three vertical dots between them indicating that any number of paths can be included, such as, but not limited to, four, five, six, etc.

In the case of framed waveforms, blocks of data may be received, each comprising frame markers delineating each frame of data, which are ingested by block 305. Block 310 identifies frame markers in the blocks of data and then assigns one frame of data for each processing block 315a-315n. The frames of data can then be processed independently and in parallel in various, parallel iterations of multiple functions as processing blocks 315a-315n. For example, a first frame of data can be processed by a group of functions in processing block 315a, and another frame of data can be processed by the group of functions in another processing block 315b-315n executed in parallel with the processing block 315a. A plurality of processing blocks 315a-315n may be executed in parallel, and is not limited to two such processing blocks. As noted above, to indicate that various number of processing blocks 315a-315n may operate in parallel, three paths are depicted with three vertical dots between them indicating that any number of paths can be included.

The term "parallel" is used herein to describe that processing occurs in the processing blocks 315a-315n at the same time. The packets being processed may be of different lengths from one processing block 315a-315n to another, so the processing of packets may have the same rate or speed from one processing block 315a-315n to the next. As noted below, some of the processing bocks 315a-315n may proceed faster or slower than others. Accordingly, the term parallel should not be limited to simultaneous or concurrent processing within the processing blocks 315a-315n.

The method 400 can further include a data combine function 320, similar to the fourth function 308 (FIG. 3), combining the processed data, and a data output function 325, similar to the fifth function 309 (FIG. 3).

In a further example, the adjustable series-parallel or parallel-series arrangement of the various functions of the method 300 provide several methods of implementing feedforward processing to replace feedback loops. This is advantageous as it can increase throughput and avoid bottlenecks caused by delays in feedback processing.

An additional advantage of the series-parallel or parallel-series processing provided by the method 300 and the method 400, is that arranging one or more of desired algorithms within a processing block (e.g., one of the five processing blocks of the method 300), allows the processor 202 to distribute the processing load (e.g., across multiple cores 204) without concern for the speed of a given algorithm within a processing block (e.g., core 204). Thus, each core 204 shares the exact same processing load and eliminates bottle necking issues caused by individual algorithms.

An additional benefit of embodiments of the method 300 can include customizing a specific order of algorithms (e.g., processing blocks) to lower the computational burden within the processor 202. As described below, the overall, multi-stage processing of a given process may be agnostic to the order of multiple sub-processes. Therefore, in some examples, ordering the fourth function 308 may have certain advantages if performed prior to the third function 306.

The method 300 can further implement different variable types for memory bandwidth optimization, such as int8, int16 and floats, for example. This can accelerate certain algorithms (e.g., based on type). In addition, this can provide increased flexibility to maximize memory bandwidth.

Figure 14:
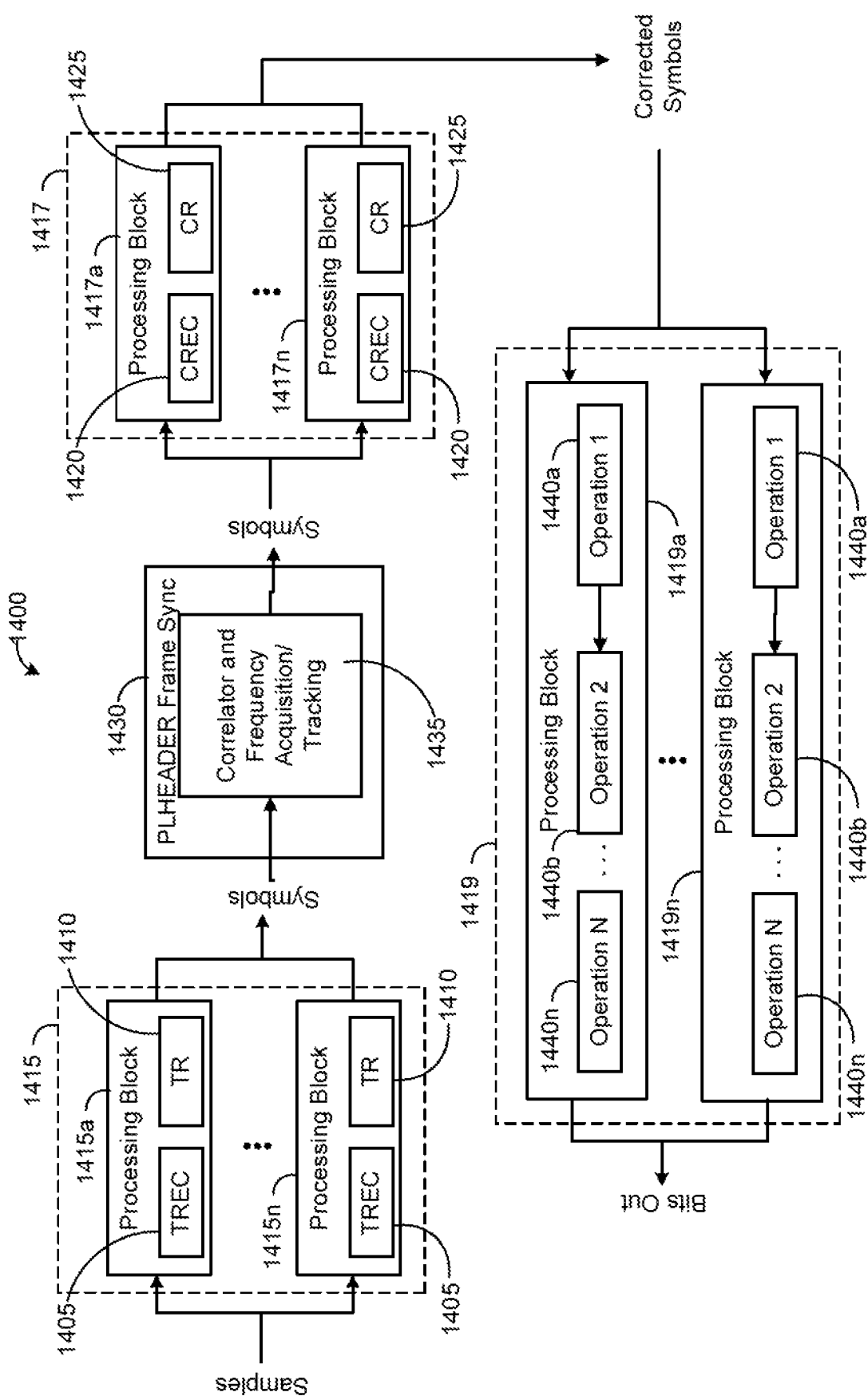
FIG. 14 is a functional block diagram of an embodiment of another system and method for signal processing of a received downlink signal, in accordance with embodiments disclosed herein.

FIGS. 5, 6, and 14 are functional block diagrams of embodiments of signal processing of downlink signals according to various embodiments disclosed herein. Methods 500, 600 and/or 1400 can include feedforward block processing as described above in connection to FIGS. 3 and 4. The method 500, 600 and/or 1400 may comprise a plurality of blocks. In some examples, each block may represent a function block and perform functions in a similar manner as the function blocks 306a, 306b, . . . 306n (FIG. 3), etc. In another example, two or more of the plurality of blocks of FIGS. 5 and/or 6 can be grouped together as a single "process" 315 that perform functions in a similar manner as the processing blocks 315a, 315b, . . . 315n (FIG. 4), etc.

FIG. 15 is a functional block diagram of an embodiment of carrier and frame acquisition of a received downlink signal according to embodiments disclosed herein. Method 1400 can include feedforward block processing as described above in connection to FIGS. 3 and 4. The method 1400 comprises a plurality of blocks. In some examples, each block may represent a function block and perform functions in a similar manner as the function blocks 306a, 306b, . . . 306n (FIG. 3), etc. In another example, two or more of the plurality of blocks of FIG. 9 can be grouped together as a single "process" 315 that perform functions in a similar manner as the processing blocks 315a, 315b, 315n (FIG. 4), etc.

At block 305, the SPS 150 can ingest or otherwise receive the digital bit stream 154 (e.g., via the network 152). The data ingest at block 305 can receive the digital bit stream data from a network connection (e.g., Ethernet).

At block 310, the data can be split into parallel data streams by a data splitter. In some embodiments, the processor 202 can perform data splitting functions required in block 310. In some other embodiments, a separate data splitting component (e.g., a data splitter) can be included in the device 200 (FIG. 2). Splitting the data into multiple parallel streams can allow parallel processing of the downlink signal, such as downlink signals 160, 170. The method 300 can therefore take advantage of feedforward or pre-calculation processing to allow the incoming digitized signal data to be broken into smaller pieces and then processed on multiple cores 204.

In some implementations, the digital bit stream 154 can be split to form overlapping packets in in-phase/quadrature (I/Q) pairs. In some embodiments, the "overlapping packets" can include data packets in which successive packets are overlapped with adjacent data packets. In some embodiments the data packets may all be the same length, but overlapped. The overlap in data packets can be at the beginning of the data packet or at the end. In addition, a data packet can overlap with both the preceding and the following data packets. The data packets can also have different lengths (e.g., varying amounts of data). Therefore, a first packet sent to the processing block 315a may overlap or otherwise repeat certain data of a second packet sent to the processing block 315b.

The amount of overlap between packets, or overlap size, can be programmable and set as needed. In some examples, the overlap can be set to one percent (1%) of the packet size. This overlap size can be increased or decreased depending on need. For example, one particular parameter that can impact the overlap size is the uncertainty of the symbol rate in the digital bit stream 154. For most signals, the worst case uncertainty is less than 1%, so a 1% overlap covers most cases. In some other embodiments, the overlap can be 2%, 3%, 4%, 5%, 6%, 7%, 8%, 9%, or as high as 10%, or anywhere in between, as needed. It is also possible to have less than 1% overlap as well. The overlap could be 0.1% or lower if the data rate uncertainty is less than 0.1%.

In another implementation, the digital bit stream 154 can be split into framed data packets according to frame markers included with blocks of data in the digital bit stream 154. In some embodiments, a block of data on the digital bit stream 154 may include one or more frame markers. In some embodiments, a frame of data may be spread across multiple blocks of data, for example, where a frame marker indicating the start of a frame is in a first block of data and a frame marker indicating the end of the frame is included in a subsequent block of data. In some embodiments, the "framed data packets" can include data packets in which successive packets having variable coding and modulation (VCM), such as DVB-S2, DVB-S2x, and the like. In some embodiments each frame of data packet may vary between each other, for example variation in phase, modulation, and length.

The processor 202 can implement single instruction, multiple data (SIMD) processing on the digital bit stream 154. In some examples, SIMD can include Advanced Vector Extensions using 512 bits (AVX-512) allowing 16 floating point operations on a single CPU core on a single CPU instruction. AVX-512, for example, can process enormous amounts of data with the CPU (e.g., the CPU 202). For example, the processor 202 (and the device 200) can receive a 500 MHZ bandwidth data stream. 500 MHz of bandwidth is significant in some respects because that is a generally accepted practical limit of a 10 Gigabit Ethernet link. Sampling the data at 500 MHz, with 8 bit samples for an I/Q pair and including parity bits, can saturate a 10 Gbit Ethernet link. The 500 MHz example is not limiting on the disclosure. Data pipes larger than a 10 Gbit Ethernet link are possible. In addition, the processing can be split into n-number of parallel blocks (e.g., block 315) to accommodate any amount of data.

Process 315 is shown in dashed lines and depicts a processing step of the method 300. Process 315 is shown in executed in multiple, parallel steps, or processing blocks 315a, 315b, ..., 315n.

The process 315 as used herein, can refer to a collection of processing functions performed by the processor 202, for example. The digital bit stream 154 can be sent into multiple parallel processing blocks 315a, 315b, ... 315n to spread the processing load across several cores 204. Individual processing blocks 315a, 315b, ... 315n can represent individual iterations of cloud processing. Thus, the processing of each of the processing blocks 315a-315n can be associated with a (cloud-based) core 204a-204n. The number of processing blocks 315a-315n needed varies based on the amount of data being processed. In some embodiments, the number of processing blocks 315a-315n can be limited by the number of logical cores available via the network 152 or, for local hardware processing, within the processor 202. In some other embodiments, memory bandwidth constraints can cause a bottle neck in the signal processing. Memory bandwidth can refer to the rate at which data can be read from or stored into a semiconductor memory (e.g., the memory 206) by a processor (e.g., the processor 202).

In some embodiments, the number of processing blocks 315a-315n can vary. In general, the fewer processing blocks 315a-315n present, the better to limit the number of cores needed for the entire process. This can further enable the system to fit into smaller virtual private cloud (VPC) machines which are cheaper to operate. A VPC can include the SPS 150 having several CPUs, for example. In some embodiments, 8 processing blocks 315a-315n can be used for a 10 Gbit Ethernet link. Such an embodiment may not include forward error correction processing blocks. In some other embodiments, the only practical limitation on the number of processing blocks 315a-315n needed is the bitrate and bandwidth of the communication link (e.g., size of the pipe).

However, any number (n) of processing blocks 315a-315n is possible. In some embodiments, however a practical limitation on the number (n) processing blocks 315a-315n may be present based on the number of threads that can be run on a CPU or the number of cores 204 in the processor 202. However, if the limits are reached within a single CPU, multiple CPUs (e.g., the processor 202) together within the SPS 150 (e.g., a VPC) can have an unlimited number of cloud-based CPUs or cores 204 to perform the processing. In addition, the processor 202 can create new processing block 315a-315n as needed. The processing cores 204 can be spread across multiple distributed processors (e.g., the processor 202) as needed for throughput and efficiency.

In another example, the number of processing blocks 315a-315n may be based on a ingestion rate at which blocks or frames of data are ingested by block 305 and the processing capabilities (e.g., a processing rate) of each processing block 315a-315n, which is a rate at which each block is able to process a block or frame of data. For example, the number of processing blocks 315a-315n may be determined by dividing the ingestion rate by the processing rate. As an illustrative example, in a case where the ingestion rate is 20 blocks or frames of data ingested per microsecond and each processing block 315a-315n takes 1 microsecond to process each block or frame of data, then 20 processing blocks 315a-315n may be a minimum number (n) of processing block. If fewer than 20 processing blocks are used, then a bottleneck may occur and blocks may be held in a buffer while a process block completes the process. In some embodiments, the processing rate may be an average of processing rates of all processing blocks. In another example, the lowest processing rate may be used as the overall processing rate to ensure that all processing blocks are completed.

The processing blocks 315a-315n are arranged in such a way that it does not matter which processing block 315a, 315b, ... 315n are performed the slowest (or fastest). The method 300 can share the processing load across the processing blocks 315a-315n and therefore alleviate any processing delays caused by bottle necking issues at individual processing blocks 315a-315n. For example, individual subprocesses of the processing blocks 315a-315n (see description of FIG. 4, below) may not be performed or occur at equal rates (e.g., some are faster than others). Accordingly, larger process of the method 400 (FIG. 4), for example, can account for variations in performance or processing times. The processing blocks 315 can then be created as many times as needed to handle the incoming data.

In some embodiments, each processing block 315a-315n can represent a collection of signal processing algorithms performed by the processor 202. As used herein, an algorithm can refer to the smallest collection of functions or method steps that perform a desired function. Multiple exemplary algorithms are described herein.

An exemplary benefit of the method 300 is the ability to create more processing blocks 315a-315n when needed. In general, the processing blocks 315a-315n can be implemented in software, and so can be created or eliminated as needed to suit a given data rate or processing load. Each processing block 315a-315n can be rearranged to fit the needs of different received waveforms (e.g., the downlink signals 160 and/or 170) and the associated digital bit streams 154.

At block 320 the processed signal data from the multiple processing blocks 315 can be recombined to form the original data encoded and modulated on the downlink signal 160, 170. In some embodiments, the processor 202 can perform the functions of a data recombiner. In other embodiments, the device 200 can have an additional component to perform such functions. Each data packet or processed block of data can have a time stamp. The data recombiner (e.g., the processor 202) can order the data blocks based on the time stamps and compare the phase between the ordered blocks. The recombiner can further adjust the phase of adjacent blocks to reorder the data stream. In some embodiments, the phase of a subsequent data block can be adjusted to match the phase of a previous data block.

For all processing blocks shown in process 315, there are at least four options for running:

1) Multiple blocks running, with each sub-element (e.g., each block 315a-315n) within the processing block 315 getting its own core (e.g., cores 204a-204n);
2) Multiple blocks running, with the processing block 315 getting just one dedicated core for the entire block;
3) Single block running with each sub-element within the processing block getting its own core; and
4) Single block running with the processing block getting just 1 dedicated core for the entire block.

The more cores that can be run, the higher achievable rates.

At block 325, the device 200 can output the data to an appropriate receiver. In some examples such a receiver can be one or more mission operations centers. This data can be mission dependent (e.g., the purpose of the satellite), and can include, among other things, weather data, image data, and SATCOM payload data.

In general-purpose CPUs, there are at least three main factors that may limit high rate performance: 1) Data ingest, 2) CPU capacity, and 3) memory bandwidth utilization. Data ingest refers to how fast data can be fed into the CPU. CPU capacity is driven by the CPU clock speed and the number of cores within the CPU. Memory bandwidth refers to how quickly data can be transferred to/from the CPU to external DDR RAM (not CPU cache). Memory bandwidth may be determined by the number of memory lanes and the DDR RAM clock speed. In certain cases, the limiting factor for achieving high rate processing is CPU capacity but in other cases it is memory bandwidth. Care must be taken to determine which of the above cases is impacting the performance and if it is memory bandwidth limited, the embodiments described below are non-limiting examples of ways to lower the memory bandwidth utilization within the proposed patent approach.

Function calls within a given processing block can be arranged in such a manner to optimize CPU computation or memory bandwidth utilization. For example, referring to function calls (illustratively depicted as blocks) shown in FIG. 5, for the given example, the various function calls (e.g., timing recovery error calculation block, timing recovery block, carrier recovery error calculation block, and carrier recovery block) can be grouped in such a way to minimize memory bandwidth. These function calls can be called independently so that each function is completed on a set of data before another function starts, so to simplify each function. In another example, a plurality of or all of the function calls can be combined into one block, such that data is not transferred to RAM after each executed function and the memory bandwidth for the combined function is much smaller then called independently. In the case of independently called functions, a first function call (e.g., the timing recovery error calculation) may be performed over the whole data set before a second function call (e.g., the timing recovery) would occur. In the case of combining, just a portion of data would be processed in the first function call before the second is executed. In this way, memory bandwidth drops. This method can apply to any grouping of functions, not just those illustrated in FIG. 5. For example, the method may be applied to the methods shown in FIG. 6 or any other grouping for function calls to be executed in a block as disclosed herein (e.g., the various function call blocks illustrated in FIGS. 7-9, 14 and 15).

Another way to improve memory bandwidth utilization may be to collapse several function call blocks into one block similar to the approach described above. For example, as described in greater detail below with reference to FIGS. 5, 6, 14, and 15, a plurality of functions may be necessary to perform timing and/or carrier recovery. Normally, for ease of operation and CPU optimization, each function may require its own block, but to lower memory bandwidth utilization, functions can be grouped into one or more processing blocks, each comprising a plurality of function calls. This tradeoff lowers memory bandwidth utilization for a hit in CPU performance.

FIG. 5 is a functional block diagram of an example of a method for signal processing of a received downlink signal, in accordance with embodiments disclosed herein. For example, FIG. 5 illustrates method 500 comprising a plurality of blocks, one or more of which may be implemented as a process 315 such that the groupings of blocks are processed in each of processing blocks 315a-315n of FIG. 4. Each of the blocks of method 500 may also each be implemented as a function 306 such that a single block can be executed across functions 306a-306n of FIG. 3. Execution of a block according to FIG. 3 may be performed separately or in combination with execution of a process according to FIG. 4.

The method 500 can be used for standard waveform processing as opposed to offset waveforms described below. For example, standard waveform processing can be used for waveforms that map bits into symbols and then modulate the symbols onto a carrier wave. Examples of standard waveforms include binary phase shift keying (BPSK), quadrature phase shift keying (QPSK), 8PSK, 16APSK, 32APSK and 64 APSK as well as quadrature amplitude modulation (QAM) waveforms.

At block 505 the processor 202 (e.g., one or more of the cores 204) can perform a timing recovery error calculation on received data packets (e.g., samples of the digitized bit stream 154 or the digitized downlink signal 160 and/or 170 received by receiver 212). The timing recovery error calculation can provide needed phase information to properly align a matched filter to the incoming data stream (e.g., the digitized bit stream 154). The match filter is used to match the transmitted waveform in the time domain and is aligned by the timing error to capture all the energy in the received signal to optimize performance. An example of the process of block 505 is described in connection with FIG. 7. The results of the timing recovery error calculation can include three parameters: 1) starting phase in degrees; 2) frequency adjustment in Hertz (Hz); and 3) Doppler rate adjustment in Hz/sec. The foregoing units are exemplary and are not limiting on the disclosure. Other equivalent units are also possible.

At block 510 the processor 202 (e.g., one of the cores 204) can perform a timing recovery on the packets to align an internally generated match filter to the received samples that were generated with the modulator's respective match filter. The alignment is based on the calculation in block 505. The output of block 510 is the synchronized (e.g., time-corrected) symbols within the data packets received at block 505.

At block 520 the processor 202 (e.g., one of the cores 204) can perform a carrier recovery error calculation on the packets to determine phase and frequency information. A more detailed explanation of an example of the functions performed in block 415 is described below in connection with FIG. 8.

At block 525 the processor 202 (e.g., one of the cores 204) can perform a carrier recovery on the packets based on the calculation in block 520. Carrier recovery compensates for unknown frequency, Doppler rate, and phase offsets in the downlink signal (e.g., downlink signals 160 and/or 170) from the satellite 111 and/or platform 110. The two most common sources of uncertainty are the Doppler effects from motion of the satellite/platform and from imperfect oscillators within the satellite/platform. The processor 202, at block 525, can apply the phase, frequency, and Doppler rate corrections from block 520 to form a synchronous symbols corresponding to the modulated data in the downlink signal at the output of block 525.

As described above, the plurality of blocks of method 500 may each represent a function and may be implemented as one or more of the function 306a, 306b, . . . 306n (FIG. 3).

For example, in an illustrative example, the block 505 may be implemented as function 306 of FIG. 3, such input samples may be split into blocks of data and processed in parallel functions 306a-306n. Similarly, blocks 510, 520, and/or 525 may be implemented as separate functions 306 and each executed as a plurality of functions 306a-306n to process a plurality of blocks of data in parallel.

In another example, alone or in combination, a plurality of blocks shown in FIG. 5 can be grouped together as a single "process" 515 that perform functions in a similar manner to the process 315 of FIG. 4. That is, a plurality of blocks of FIG. 5 may be grouped together as process 515 and executed in multiple, parallel iterations as processing blocks 315a, 315b, . 315n (FIG. 4). For example, different portions of the method 500 can be grouped together as a processing 515 (e.g., blocks 505-525 in this example) and run in series-parallel and/or parallel-series processing as described above in connection to FIG. 4. In the illustrative example shown in FIG. 5, with reference to FIG. 4, the input samples may be ingested at block 305, split into overlapping blocks of samples at block 310, and each overlapping block of data may be processed in multiple, parallel iterations of process 515 as processing blocks 315a-315n. The processed overlapping data blocks are then output to the data combine 320 for combining the processed data and then output by block 325 for processing by a subsequent block of method 500.

While a specific example of blocks are shown grouped together as a process 515, this example is not intended to be limited and any grouping of one or more blocks of method 500 may be grouped together as process 515 and executed in parallel as described in connection with FIG. 4. For example, the plurality of blocks shown in FIG. 5 can be grouped together as a plurality of "processes" that each perform functions in a similar manner to the process 315 of FIG. 4. As an illustrative example, block 505 and block 510 of the method 500 can be grouped together as a first process 515 and blocks 520 and 525 grouped together as a second process 515 and each ran in series-parallel and/or parallel-series processing as described above in connection to FIG. 4, as described above.

In various examples, the plurality of blocks of FIG. 5 may be implemented using SIMD processing techniques as described throughout the present disclosure. SIMD techniques may offer increased throughput and minimized memory bandwidth requirements. Increasing the functionality of each processing block executed using SIMD techniques may serve to provide increased minimization of memory bandwidth requirements.

FIG. 6 is a functional block diagram of an embodiment of another method for signal processing of a received downlink signal, in accordance with embodiments disclosed herein. A method 500 can be similar to the method 400 (FIG. 4), combining and rearranging some of the steps. For example, FIG. 6 illustrates method 600 comprising a plurality of blocks, one or more of which may be implemented as a process 315 such that the groupings of blocks are processed in each of processing blocks 315a-315n of FIG. 4. Each of the blocks of method 600 may also each be implemented as a function 306 such that a single block can be executed across functions 306a-306n of FIG. 3. Execution of a block according to FIG. 3 may be performed separately or in combination with execution of a process according to FIG. 4.

The method 600 can be used for offset waveform processing. For example, offset waveform processing can be used for waveforms having an offset or stagger between the In-phase (I) and Quadrature (Q) channels, such as waveforms like Offset quadrature phase-shift keying (OQPSK), minimum-shift keying (MSK), Gaussian minimum-shift keying (GMSK), and shaped-offset quadrature phase shift (SOQPSK).

At block 605, the processor 202 can perform a timing and carrier recovery error calculation on the packets. The timing recovery error calculation and the carrier recovery error calculation are similar to those performed in block 505 and 520 (FIG. 5). In the method 600 though, the carrier recovery is performed before timing recovery of the symbols. The input to the method 500 is the data samples and the output is corrected, synchronous symbols. Sub-steps of block 605 are described below in connection with FIG. 9.

At block 625, the processor 202 can perform a carrier recovery operation based on the calculation from block 605. The carrier recovery operation may be similar to those performed in block 525 (FIG. 5).

At block 610, the processor 202 can perform a timing recovery operation based on the calculation from block 505. The timing recovery operation may be similar to those performed in block 510 (FIG. 5).

As described above, the plurality of blocks of method 600 may each represent a function and may be implemented as one or more of the function 306a, 306b, . . . 306n (FIG. 3). For example, any one or more of blocks 605, 610, and 625 may be implemented as function 306 of FIG. 3, such input samples may be split into blocks of data and processed in parallel functions 306a-306n.

In another example, alone or in combination, a plurality of blocks shown in FIG. 6 can be grouped together as a single "process" 615 that perform functions in a similar manner to the process 315 of FIG. 4. That is, a plurality of blocks of FIG. 6 may be grouped together as process 615 and executed in multiple, parallel iterations as processing blocks 315a, 315*b*, . . . 315*n* (FIG. 4). For example, different portions of the method 600 can be grouped together as a processing 615 and run in series-parallel and/or parallel-series processing as described above in connection to FIG. 4. In the illustrative example shown in FIG. 6, with reference to FIG. 4, the input symbols may be ingested at block 305, split into overlapping blocks of symbols at block 310, and each overlapping block of data may be processed in multiple, parallel iterations of process 615 as processing blocks 315*a*-315*n*. The processed overlapping data blocks are then output to the data combine 320 for combining the processed data and then output by block 325 for processing by a subsequent block of method 600.

While a specific example of blocks are shown grouped together as a process 615, this example is not intended to be limited and any grouping of one or more blocks of method 600 may be grouped together as processing 615 and executed in parallel as described in connection with FIG. 4. For example, blocks 625 and block 610 of the method 600 can be grouped together as a process 615 and run in series-parallel and/or parallel-series processing as described above in connection to FIG. 4, as described above.

In various examples, the plurality of blocks of FIG. 6 may be implemented using SIMD processing techniques as described throughout the present disclosure. SIMD techniques may offer increased throughput and minimized memory bandwidth requirements. Increasing the functionality of each processing block executed using SIMD techniques may serve to provide increased minimization of memory bandwidth requirements.

Figure 7:
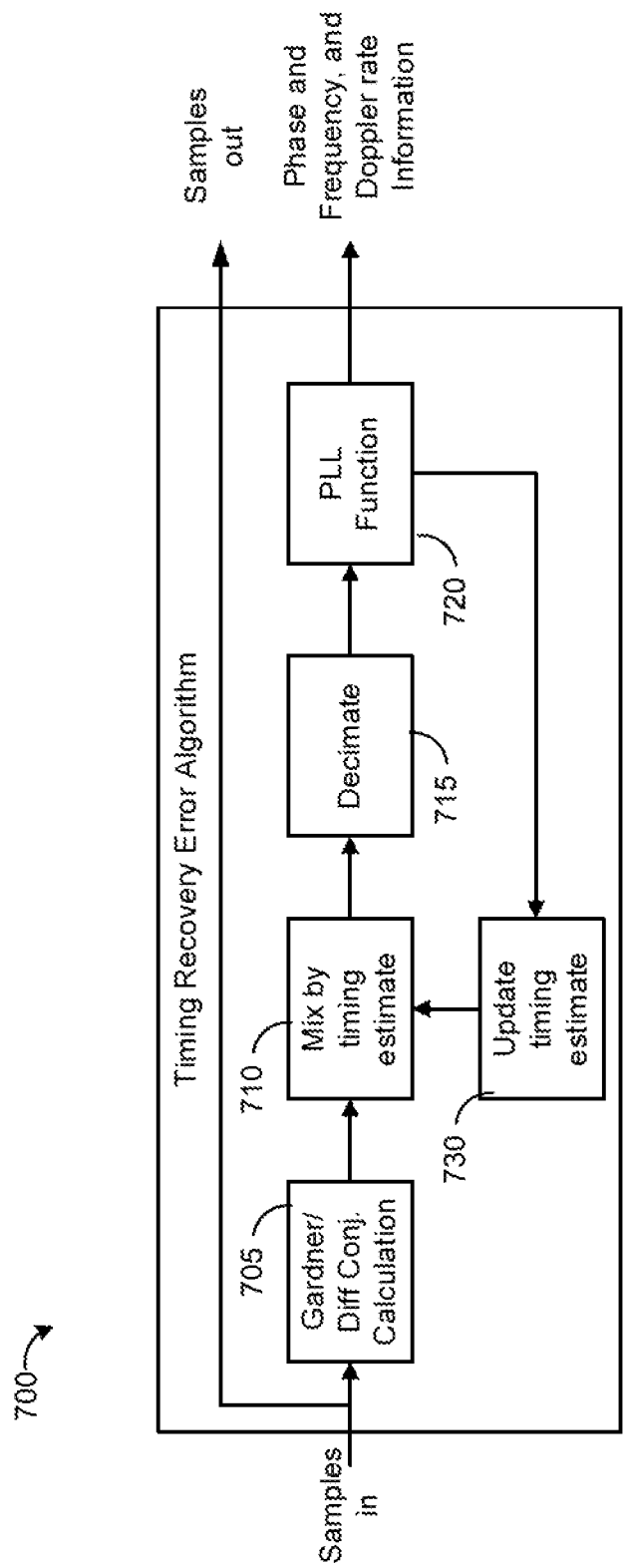
FIG. 7 is a functional block diagram of an example of a timing recovery error algorithm, in accordance with embodiments disclosed herein.

FIG. 7 is a functional block diagram of an example method for timing recovery error algorithm, in accordance with embodiments disclosed herein. FIG. 7 illustrates method 700 which is an example method for timing recovery error calculation of block 505 in FIG. 5 utilizing a phase locked loop (PLL) function.

At block 705, the processor 202 can apply a Gardner Timing Error Detector to the incoming data to create the timing information, as is known in the art. In another embodiment, the incoming sample stream can be delayed by one sample. Then the non-delayed data can be multiplied by the conjugate (conjugate multiplication) of the delayed data. Both have advantages and drawbacks so it is an engineering tradeoff on which may be implemented.

Both the Gardner Timing Error Detector and conjugate multiplication can result in a timing spike in the frequency domain. The "timing spike" appears as a single frequency tone in the frequency domain. The timing spike contains the timing estimation information, including starting phase in cycles, degrees, or radians, timing frequency offset in Hz and timing Doppler estimation in Hz/sec. The timing spike can be mixed to DC by the estimated symbol rate and then filtered and decimated to improve signal-to-noise ratio to improve the accuracy of the phase, frequency and Doppler Rate estimate. The carrier frequency and symbol rate estimate is initially derived from an acquisition function. The carrier frequency and symbol rate estimation is calculated similarly to the feed forward error recovery algorithms. There are two main differences: 1) the decimation is much less to enable a wider frequency range to be detected and 2) the phase unwrap and curve fit calculation is replaced with an FFT followed by a peak search calculation. Once the initial estimate is derived, the estimate is later updated (e.g., within the block 630).

Both methods have the benefit of being fairly insensitive to carrier uncertainty and therefore can be run before carrier recovery. Another benefit to running the timing recovery step first is this drops the sample rate down from about two times (2×) the symbol rate to exactly 1× the symbol rate and therefore the carrier recovery algorithm runs at the lowest rate possible. Another benefit is the carrier recovery loop can then operate with an improved signal-to-noise ratio since the sample rate is now half the original sample rate.

At block 710 the processor 202 can mix the timing spike generated at block 705 with a timing estimate or an estimate of the symbol rate. As the method 700 is initiated, certain information about the downlink signal 152 may not be known. Accordingly, at block 710 the processor 202 may use an initial estimate of the symbol rate to mix with the timing spike from block 705. This estimate is later updated, as described below. This process can mix the time spike to DC so it can be easily filtered by a decimation filter. The block 705 and the block 710 can provide a timing error of the data packets/data samples.

At block 715 the processor 202 can decimate the mixed signal to reduce the sampling rate. Decimation can improve the signal-to-noise ratio since the power in the timingspike (the signal) is passed entirely through the filter but the noise power is reduced proportional to the decimation rate.

At block 720 the processor 202 can perform a PLL function on the decimated samples to obtain phase, frequency, and Doppler rate offset information that can be output (e.g., to timing recovery block 510) and applied to update the timing estimate at block 730. In the case of overlapping data, the PLL function may be a second order PLL. However, other PLL functions may be utilized, for example but not limited to, a third order PLL, higher order PLL, a RPLL, a RIPLL, etc. Block 720 receives the decimated samples and uses the overlap of data between data packets to ensure the PLL has settled based on the programmed loop bandwidth by the time non-overlapped data of the data block is processed. In some embodiments, the PLL function 720 may be pre-seeded using estimates of phase, frequency, and Doppler rate offset information obtained through carrier acquisition techniques (for example, such as those described in connection with block 1430 of FIG. 14 and blocks 1506 and 1520 of FIG. 15). As another example, in the case of framed data, the PLL function may be pre-seed by calculating a frame marker phase and using this information to pre-seed the PLL function, such that the PLL function starts with the phase ambiguity removed. A more detailed explanation of an example of the functions performed in block 720 is described below in connection with FIG. 10.

While the timing recovery error algorithm of FIG. 7 is described using a PLL function, the scope of the present disclosure is not intended to be limited to such implementations only. For example, in some implementations, block 720 may be replaced with a phase unwrap calculation performed on the decimated samples and a curve fit calculation to determine phase, frequency, and doppler rate offset information. An example of which is provided in U.S. Pat. No. 10,790,920.

The output of the method 700 is the originally received samples and associated metadata (e.g., the phase, frequency, and Doppler rate information). Utilizing a PLL function at block 720 may provide several benefits as described above. First, utilizing a PPL in the feed-forward processing as disclosed herein may operate similar to a standard feed-back receiver that employs a PLL, thereby maintaining consistency. Second, utilizing a PPL in the feed-forward processing as disclosed herein handles quick, unpredictable phase jumps that a curve fit filter is not capable of accounting for.

Figure 8:
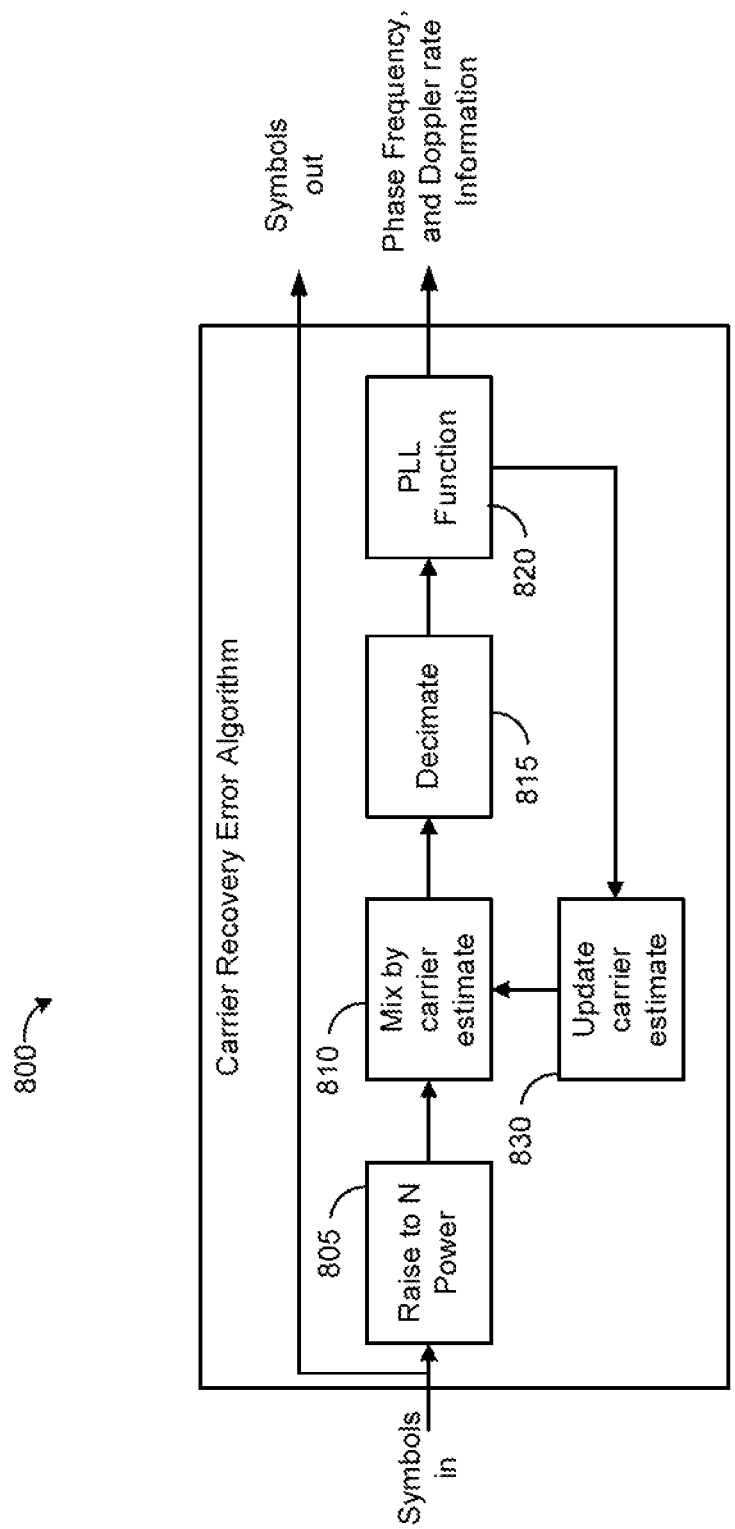
FIG. 8 is a functional block diagram of an example of a carrier recovery error algorithm, in accordance with embodiments disclosed herein.

FIG. 8 is a functional block diagram of an example of a method for carrier recovery error algorithm, in accordance with embodiments disclosed herein. FIG. 8 illustrates a method 800, which is an example method for carrier recovery error calculation of block 520 in FIG. 5 utilizing a PLL function. The method 800 can be used to calculate the needed phase, frequency, and Doppler rate information to create a mixing signal to properly demodulate the incoming symbol synchronized signal.

At block 805, the incoming signal can be raised to certain power based on modulation type (e.g., BPSK raises to the power of 2; QPSK raises to the power of 4; 8PSK raises to the power of 8). Raising the signal to a power may include multiplying the signal by itself n-number of times, where n is an integer. This may also be referred to herein as exponentiating the signal. The result of such calculation is a carrier spike in the frequency domain (e.g., a continuous wave signal) that can be mixed to DC with a carrier estimate at block 810. The estimate can be generated using the center frequency related to where the carrier spike lands in the frequency domain, for example the acquisition function described below in connection with FIG. 15.

At block 815 the processor 202 can decimate the mixed signal to reduce the sampling rate, similar to block 715 (FIG. 7) above. Decimation can improve the signal-to-noise ratio since the power in the timing spike (the signal) is passed entirely through the filter but the noise power is reduced proportional to the decimation rate.

At block 820 the processor 202 can perform a PLL operation on the decimated samples similar to block 720 (FIG. 7) above to obtain phase, frequency, and Doppler rate offset information that can be applied to update the carrier recovery algorithm (block 520 of FIG. 5).

At block 830, the output from block 820 can be used to update (and improve) the carrier frequency estimate of block 810.

Figure 9:
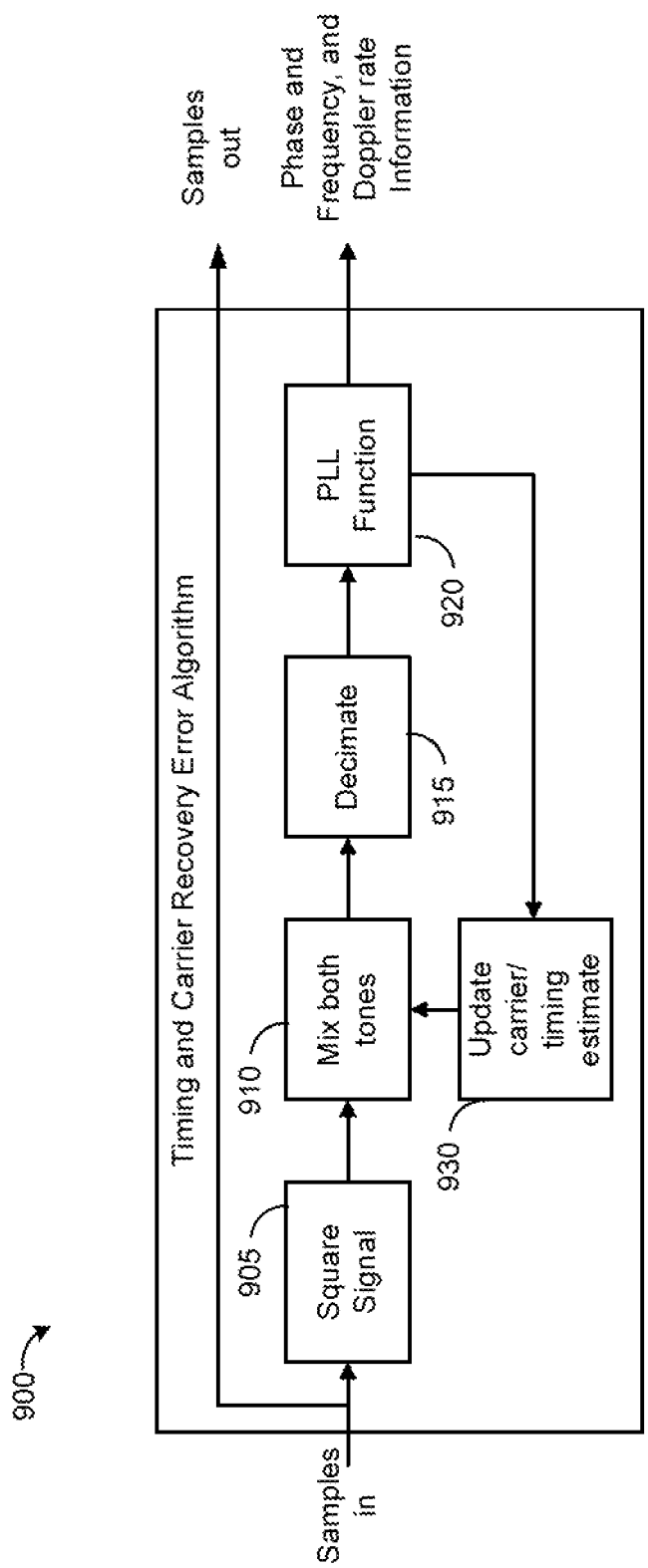
FIG. 9 is a functional block diagram of an example of a timing and carrier recovery error operation, in accordance with embodiments disclosed herein.

FIG. 9 is a flowchart of a method for the timing and carrier recovery error algorithm, in accordance with embodiments disclosed herein. FIG. 9 illustrates method 900, which is an example method for timing and carrier recovery error calculation of block 605 in FIG. 6 utilizing a PLL function. For waveforms with a half-symbol stagger between the I and Q legs, timing and carrier recovery can be performed together. Some such waveforms can include OQPSK, MSK, and GMSK, for example. The digitized bit stream 154 can be squared (power of 2) at block 905. This can result in two spikes being created in the frequency domain. Each spike can then be mixed near 0 Hz by the mix signal that is created from a composite estimate of the carrier frequency and symbol rate. The estimate can be generated using the acquisition function described below in connection with FIG. 15.

At block 910, both mixed signals are then decimated at block 915 to reduce the sampling rate.

At block 920, the processor 202 can perform a PLL function on both mixed signals similar to block 720 of FIG. 7 and block 820 of FIG. 8. At block 820 there are PLL functions that occur. The sum of the output from two PLL functions is the carrier phase information for the signal and the difference is the timing phase information for the signal. The output of the method 900 is the originally received samples and associated metadata (e.g., the phase, frequency, and Doppler rate information). However, unlike block 720 and block 820, the system can output data for both the carrier and timing estimates.

At block 930, this information is updated (similar to block 730 and block 830) and passed onto the carrier recovery and timing recovery algorithms in the order as shown in FIG. 6.

Figure 10:
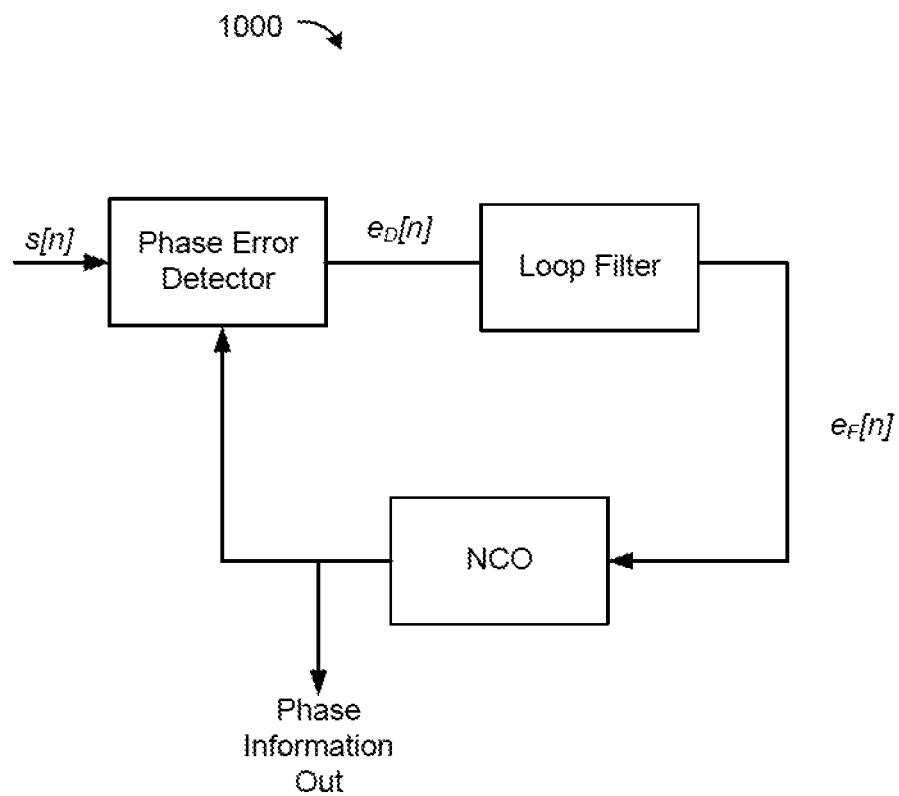
FIG. 10 is a functional block diagram of an example phase lock loop (PLL) function, in accordance with embodiments disclosed herein.

FIG. 10 is a functional block diagram of an example PLL function, in accordance with embodiments disclosed herein. In the example embodiment herein, FIG. 10 illustrates second order PLL 1000. A second order PLL may be implemented as the PLL function of blocks 720 (FIG. 7), 820 (FIG. 8), and/or 920 (FIG. 9). As set forth above, the PLL function of blocks 720, 820, and 920 is not limited to a second order PLL as shown in FIG. 10, but may be implemented as any PLL. For example, a third order PLL and the like.

PLL 1000 is an illustrative example of a second order PLL that may be used to synchronize a received waveform with a reference waveform and output phase information as set forth above. The PLL 1000 adjusts an input signal s[n] to an oscillator based on a phase error, such that the phase error converges to zero thereby reaching a stable state.

As shown in FIG. 10, PLL 1000 comprises a phase error detector configured to receive input signal s[n] and determine a phase difference between a reference input waveform and a locally generated waveform. The phase error detector computes the phase error, which is labeled $e_D[n]$ error. The signal $e_D[n]$ is then provided to a loop filter that filters out noise and unnecessary frequency components in the output from the phase error detector (e.g., $_D[n]$). The loop filter outputs signal $e_F[n]$ to a numerically controlled oscillator (NCO), which generates a waveform having a phase that is as close to the reference signal as possible. The signal $e_F[n]$ represents the frequency adjustment to the NCO at a given decimated data time slice n. The generated waveform is then feedback into the phase error detector.

In some embodiments, the reference input waveform of the PLL function 1000 may be pre-seeded using estimates of phase, frequency, and Doppler rate offset information obtained through carrier acquisition techniques (for example, such as those described in connection with block 1435 in FIG. 14 and blocks 1506 and 1520 of FIG. 15). As another example, in the case of framed data, the PLL function may be pre-seed by calculating a frame marker phase and using this information to pre-seed the PLL function, such that the PLL function starts with the phase ambiguity removed.

From the PLL function 1000, the phase information may be outputted following the NCO. The phase output is an array or vector of phase elements that reflect the phase, frequency, and Doppler rate offset information for the input signal s[n]. For example, in the case of method 700, the PLL function at block 720 receives decimated samples as the input signal s[n] and obtains phase, frequency, and Doppler rate offset information that can be applied to update the timing estimate at block 630 and output downstream for timing recovery at block 510 of FIG. 5. Similarly, in the case of method 800, the PLL function at block 820 receives decimated symbols as the input signal s[n] and obtains phase, frequency, and Doppler rate offset information that can be applied to carrier recovery at block 525 of FIG. 5. Further still, in the case of method 900, the PLL function at block 920 receives decimated samples as the input signal s[n] and obtains phase, frequency, and Doppler rate offset information that can be applied to carrier recovery at block 610 of FIG. 6.

Figure 11:
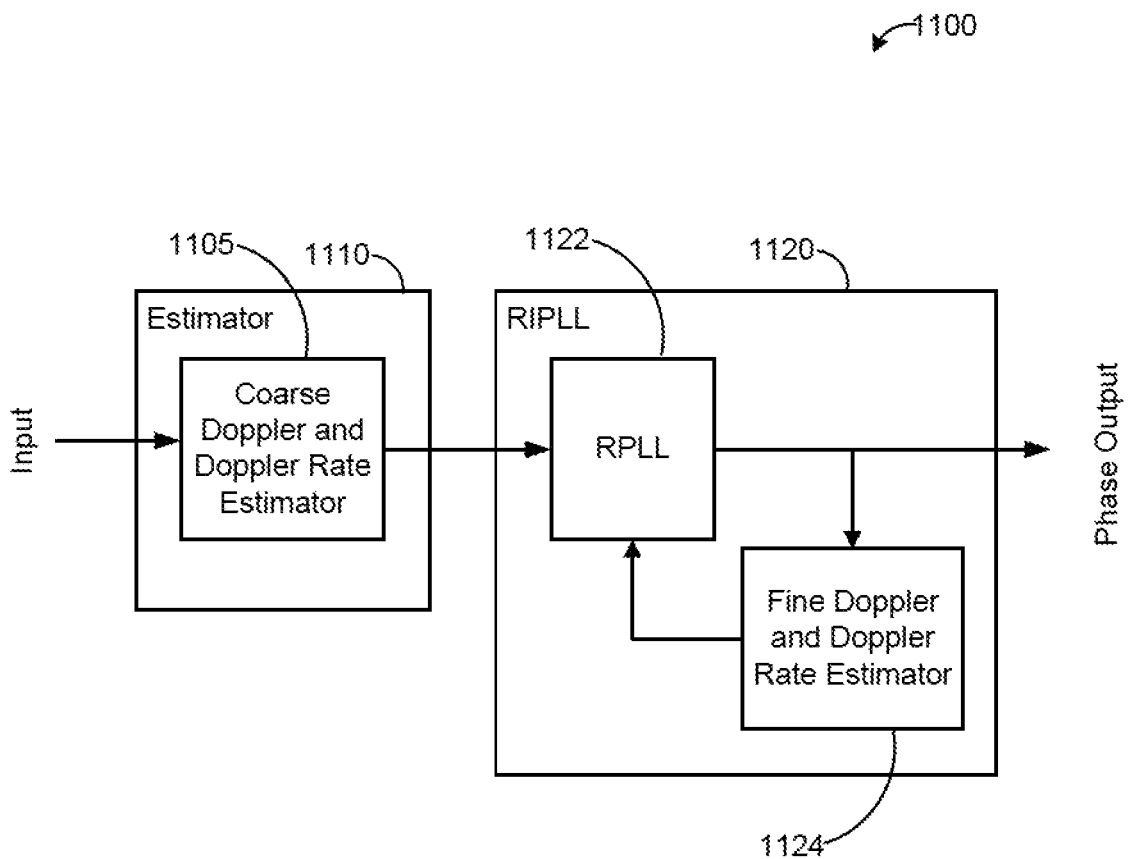
FIG. 11 is a functional block diagram of another example of a PLL function, in accordance with embodiments disclosed herein.

FIG. 11 is a functional block diagram of another example PLL function, in accordance with embodiments disclosed herein. FIG. 11 illustrates a PLL function 1100 that may be implemented as the PLL function of blocks 720 (FIG. 7), 820 (FIG. 8), and/or 920 (FIG. 9).

In the illustrative example of FIG. 11, the PLL function 1110 includes a RIPLL 1120. The RIPLL 1120 comprises a RPLL 1122 and a fine Doppler and Doppler Rate estimator 1124. The RIPLL 1120 receives an input signal from an estimator 1110. The estimator 1110 receives an input signal, for example, with reference to FIG. 7, 8, or 9, decimated data, In the case of the method 700, the estimator 1110 receives decimated samples as an input signal. In the case of method 800, decimated symbols are provided as the input signal. At the estimator 1110, a coarse Doppler and Doppler Rate estimator 1110 processes the input signal to obtain a rough estimation of phase, frequency, and Doppler rate offset information. In some embodiments, estimator 1105 may be implemented, for example, as carrier and frame acquisition methods such as those described in connection with block 1430 in FIGS. 14 and 1520 of FIG. 15.

The rough estimate of the phase, frequency, and Doppler rate offset information are input into the RPLL 1122. At the RPLL 1122, a PLL (e.g., the second order PLL 1000 of FIG. 10 or the like) may be performed both forward and backward on the received information. A classic PLL runs forward in time since it only can process one input signal at a time. With the feed-forward process disclosed herein, this constraint is removed since the whole block of data is processed after data collection and not real time in the case of a classic analog PLL. Accordingly, the RPLL 1122 may be able to fix an initial loop response drawback of a conventional PLL by running over the entire input signal twice. After processing the input data in the forward direction according to a temporal ordering of the data (e.g., processing portions of the signal received first in time prior to portions received later in time), the conventional PLL is reversed and ran backwards (e.g., processing portions of the signal received last in time prior to portions received first). The PLL state information, such as an integrator value in a loop filter (e.g., loop filter of FIG. 10) and an phase accumulator value in an NCO (e.g., NCO of FIG. 10), is preserved from the forward pass and used to seed the PLL for the reverse pass.

Once the RPLL 1122 has been performed, the RPLL 1122 outputs estimation of phase, frequency, and Doppler rate offset information, which can be analyzed and refined to improve both the Doppler and Doppler Rate estimation. For example, the output from the RPLL 1122 may be ran through the fine Doppler and Doppler rate estimator 1123. For example, the estimator 1123 may execute a polyfit function on the outputted phase vector, as known in the art from the RPLL 1122. After refined Doppler and Doppler rates are measured and pre-compensated for at the estimator 1123, the RPLL 1123 can be performed a second time (e.g., a second iteration) on the data. This process is referred to herein as the reversable, iterative PLL, that is, the RPLL 1122 and estimator 1124 may be grouped as RIPLL 1124.

While the foregoing example refers to executing the RPLL 1123 for two iterations, it will be understood that the RPLL 1123 may be iteratively performed as many times as desired to reduce the loop response and bring the response as close to zero as possible. Furthermore, while the illustrative example of FIG. 11 shows a RIPLL 1120, embodiments herein are not limited to an RIPLL 1120. The iterative nature of RIPLL 1120 may be removed, such that a single iteration of RPLL 1122 is executed to obtain the phase vector, which contains Doppler, and Doppler Rate information without processing through the estimator 1124 or iterative executions of the RPLL 1122. Accordingly, reference herein to RPLL will be understood to refer to either RPLL or RIPLL.

Execution of the RPLL 1122 alone or execution of the RIPLL 1120 may remove substantially all of the error caused by the loop response of a conventional PLL. This is because, in both cases, most error inducing effects in a conventional PLL are compensated for and all that remains are non-linear effects that a conventional PLL, which are suited for tracking phase, frequency, and Doppler rate offset information.

Figure 12:
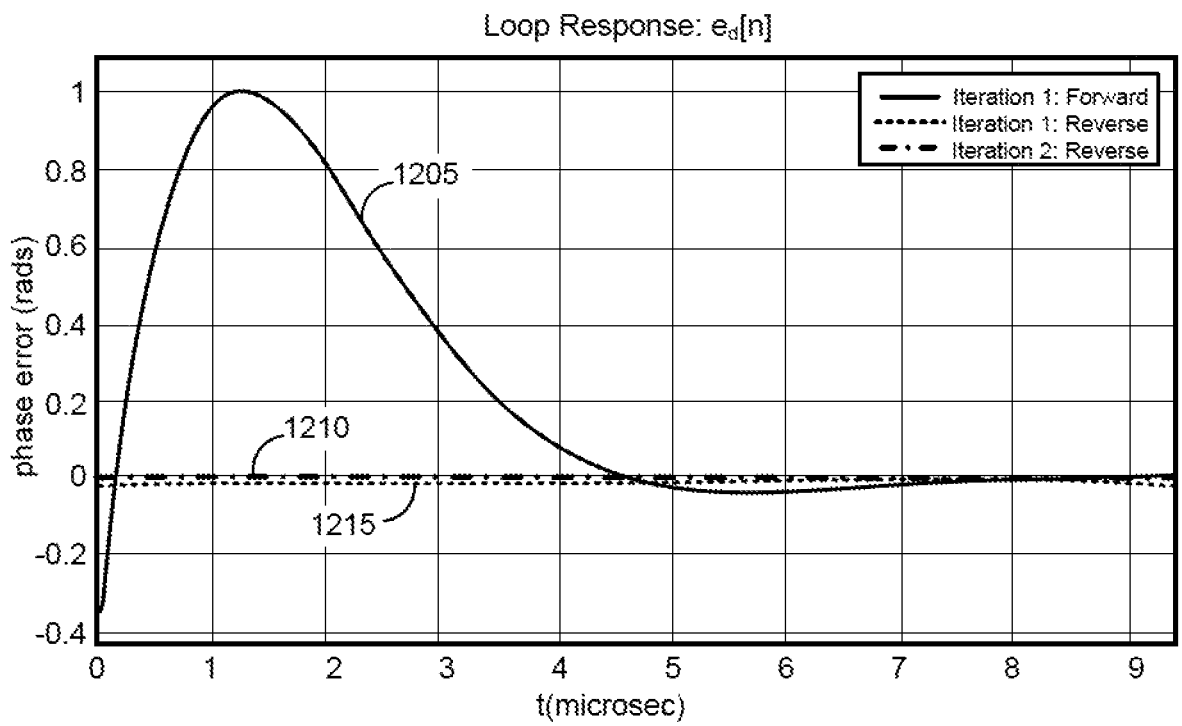
FIGS. 12 and 13 are examples of a graph of loop responses for an example PLL function, according to embodiments disclosed herein.
Figure 13:
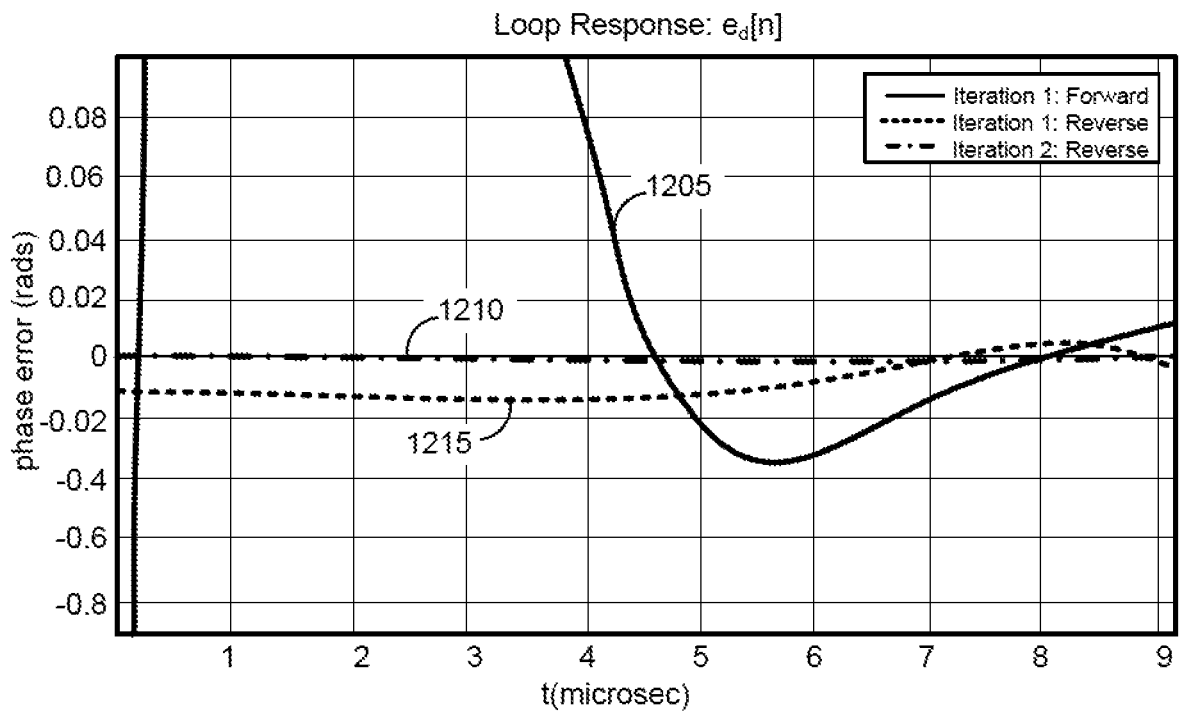

FIGS. 12 and 13 are examples of a graph of loop responses for an example PLL function, according to embodiments disclosed herein. For example, FIGS. 12 and 13 illustrate loop responses for multiple iterations of an example RIPLL (e.g., RIPLL 1120). FIGS. 12 and 13 show the same loop response in terms of phase power error in radians (e.g., the Doppler and Doppler rate error) plotted against time in seconds. FIG. 13 shows a zoomed in portion of the loop response shown in FIG. 12. FIGS. 12 and 13 show the loop response for two iterations of an RPLL (e.g., two iterations RIPLL 1120 of FIG. 11). Line 1205 shows the phase error in a first iteration of a second order PLL in the forward direction (e.g., a conventional PLL, such as PLL 1000 of FIG. 10). Line 1210 shows the phase error in a first iteration of the second order PLL in the reverse direction (e.g., execution of a RPLL, such as RPLL 1122 of FIG. 11). That is, line 1210 illustrates an example Doppler and Doppler rate error from the output of a single iteration of an RPLL. Line 1215 shows the phase error after execution of a reverse direction of a second iteration of the RPLL (note that the forward direction of the second iteration is not depicted for improved legibility of FIGS. 12 and 13).

As illustrated in FIGS. 12 and 13, the loop response of line 1205 takes approximately 9 microseconds to settle (note timescale shown in FIGS. 12 and 13 is for illustrative purposes only, and may be varied). As described above in connection to FIGS. 7-9, some embodiments disclosed herein account for the loop response of the PLL function by utilizing overlapping portions between adjacent blocks of data, while the PLL loop response settles. That is, an overlapping portion from a prior block of data may be used to process an adjacent block of data, to ensure the PLL is stable by the time the non-overlapped data is processed. Thus, the time for the loop response to settle in the adjacent block may be removed. This may be an effective method and can be computationally efficient if the overlap amount is small relative to the size of the block of data to be processed.

However, in some implementations, the size of adjacent data blocks may decrease, and the as the size becomes smaller the overlap percentage grows since the loop response of the PLL does not change in time with a fixed loop-bandwidth. This growth may have a deleterious effect on CPU performance since the data overlapped must be processed at the sample or symbol rate before decimation. However, the overlap percentage can be minimized and even reduced to 0 using a RPLL or RIPLL.

For example, as shown in FIGS. 12 and 13, line 1205 depicts a large phase error on the forward pass of the first iteration. After execution of the reverse direction on the first iteration (e.g., line 1210), there is significant improvement of the phase error as compared to the forward pass of the first iteration. Furthermore, following execution of the reverse pass of the second iteration, the phase error is nearly zero phase. Thus, FIGS. 12 and 13 illustrate that the significant improvement that can be achieve by utilizing an RPLL (e.g., RPLL 1122 of FIG. 11), and the further improvement achieved by an RIPLL (e.g., RIPLL 1120 of FIG. 11).

As noted above in connection to FIG. 10, some embodiments may obtain phase, Doppler, and Doppler Rate information using a third order PLL. A third order PLL can account for Doppler Rate error, but the initial loop response drawback may still apply and therefore an RPLL as set forth herein maintains advantages over a conventional PLLs.

While the example RPLL and RIPLL of FIG. 11 are described using a second order PLL, the embodiments herein are not intended to be limited to only second order RPLL and RIPLL. Third order RPLL and/or third order RIPLL may be utilized to enhance performance and may be implemented in a manner substantially similar to that described above in FIG. 11.

FIG. 14 is a functional block diagram of an embodiment of another method for signal processing of a received downlink signal, in accordance with embodiments disclosed herein. FIG. 14 illustrates a method 1400 that may be implemented according to the methods for signal processing in FIG. 3 and/or FIG. 4. The method 1400 may be utilized for processing framed data having minimal or no overlap between adjacent blocks of data packets. The method 1400 can be used for standard waveform processing as opposed to offset waveforms, as described above.

Method 1400 comprises a plurality of blocks, one or more of which may be implemented as a process 315 such that the groupings of blocks are processed in each of processing blocks 315a-315n of FIG. 4. Each of the blocks of method 1400 may also each be implemented as a function 306 such that a single block can be executed across functions 306a-306n of FIG. 3. Execution of a block according to FIG. 3 may be performed separately or in combination with execution of a process according to FIG. 4.

Method 1400 comprises process 1415 where processor 202 (e.g., one or more of the cores 204) can perform timing recovery error calculation block 1405 and timing recovery block 1410 on received data packets (e.g., samples of the digitized bit stream 154 or the digitized downlink signal 160 and/or 170 received by receiver 212). The block 1405 and block 1410 are similar to and perform similar functions as blocks 505 and 510 (FIG. 5), respectively. An example of the timing recovery error calculation 1405 is described in connection with FIG. 7 above.

As described above, a PLL function (e.g., a RPLL or RIPLL) may be applied at block 1405 (e.g., as PLL function 720 of FIG. 7) to reduce the reliance on overlap between data packets. One non-limiting benefit to running the timing recovery with a PLL functions, such as an RPLL (or RIPLL), is that lower latency times may be achieved. Blocks of data must be ingested over time and cannot be processed until all the samples are collected. For example, with a symbol rate 1 million symbols-per-second (sps) and a needed block size of 100,000 symbols, the time to collect enough symbols to process is 100 milliseconds. In addition to collection time, processing time also plays into total latency. Therefore, it may be beneficial for the timing recovery to employ the RIPLL, as described above.

In another example, the timing recovery error calculation block 1405 may be implemented, with reference to FIG. 7, by replacing the PLL function 720 with a phase unwrap calculation on decimated samples and a curve fit calculation to determine phase, frequency, and doppler rate offset information. An example of which is provided in U.S. Pat. No. 10,790,920.

As described above, blocks 1405 and 1410 may each represent a function and may be implemented as one or more of the function 306a, 306b, . . . 306n (FIG. 3). For example, in an illustrative example, the block 1405 may be implemented as function 306 of FIG. 3, such input samples may be split into blocks of data and processed in parallel functions 306a-306n. Similarly, block 1410 may be implemented as separate functions 306 and each executed as a plurality of functions 306a-306n to process a plurality of blocks of data in parallel.

In another example, alone or in combination, blocks 1405 and 1410 may be grouped together as a single "process" 1415 that perform functions in a similar manner to the process 315 of FIG. 4. That is, blocks 1405 and 1410 may be grouped together as process 1415 and executed in multiple, parallel iterations as processing blocks 1415a . . . 1415n. For example, the blocks 1405 and 1410 can be grouped together as a process 1415 and run in series-parallel and/or parallel-series processing as described above in connection to FIG. 4. In the illustrative example shown in FIG. 14, with reference to FIG. 4, the input samples may be ingested at block 305, split into a plurality of blocks of samples at block 310, and each block of samples may be processed in multiple, parallel iterations of process 1415 as processing blocks 1415a-1415n. The processed blocks of samples are then output to the data combine 320 for combining the processed data and then output by block 325 for processing by a subsequent block of method 1400.

In various embodiments, each processing block 1415a-1415n may process a block of samples at any given time. For example, processing block 1415a receives samples of a first portion (e.g., first block of data), processing block 1415b receives samples of second portion (e.g., second block of data), etc. Each processing block 1415a-1415n process each block and outputs time-corrected symbols for each respective block before processing a subsequent block, all of which are combined by the data combiner 320 (FIG. 4).

In some embodiments, as described above in connection with FIG. 4, the number of processing blocks 1415a-1415n may be based on an ingestion rate and a processing rate. For example, if process 1415 ingests 20 blocks per second and it takes 1 second to process each block, then at least 20 processing blocks may be required, otherwise blocks would be held in a buffer while a process block completes the process. The above represents a minimum number of processing blocks, but more than 20 processing blocks may be utilized if desired.

The output of process 1415 is blocks of time-corrected symbols within the blocked data packets received by process 1415. The combined output (e.g., following a data combine process 320) from process 1415 is provided to a PLHEADER frame sync block 1430, which ingests the output stream of blocks of data (e.g., blocks of symbols from process 1415) and outputs frames of data (e.g., frames of symbols).

For example, each block of time-corrected symbols from process 1415, including one or more frame markers attached thereto (e.g., as metadata), are output to block 1430. Block 1430 locates frame boundaries by detecting the frame markers in each block of data. For example, block 1430 searches for the frame markers included with each block and executes a correlator and frequency tracking process (block 1435) to locate the frame boundaries and track the carrier frequency. In some embodiments, block 1435 may perform functions similar to those described below in connection with FIG. 16 to detect the frame markers. For example, with reference to FIG. 16, block 1435 calculates different frequency trial bins (e.g., block 1605), which are then mixed by coarse carrier frequency provided by Diff Conjugate calculation (if provided) at the sub-function block (e.g., block 1610). From the mixed signal, block 1435 detects a start-of-frame (SOF) (e.g., block 1615) to identify a possible candidate frame marker within each frequency trial bin. Once a possible candidate frame marker is found, all frame marker possibilities are correlated against the candidate frame marker and if the correlation result is strong enough then the frame marker of the start of the frame is detected from the correlation (e.g., block 1620).

For example, block 1430 may detect Attached Sync Marker (ASM) in the case of framed waveforms or detect a PLHEADER in the case of DVB-S2, DVB-S2x, and the like. For example, in the case of DVB-S2, the block 1430 searches for the PLHEADERs of each block and executes the correlator and frequency acquisition/tracking block 1435 to locate the frame boundaries and track the carrier frequency. As an illustrative example, block 1435 detects a start-of-frame (SOF) in the located PLHEADERs to identify a possible candidate PLHEADER. Once a possible candidate PLHEADER is found, all PLHEADER possibilities are correlated against the candidate PLHEADER and if the correlation result is strong enough then a PLFRAME is detected from the correlation. In the case of burst waveforms, ASM may be located by block 1435 performing correlation using FFT and IFFT techniques, as is known in the art. In some embodiments, block 1435 may be performed functions similar to those described below in connection with block 1520 of FIG. 15.

In some implementations, block 1430 may not be distributed into multiple processing or functional blocks. Block 1430 may receive time-corrected symbols for all frames, such that frame boundaries may be located between adjacent frames of data and all frames of data synchronized accordingly.

In some examples, a frame of data may be spread across multiple adjacent blocks of data. In this case, block 1430 identifies the frame markers delineating the start of a frame and an end of the frame and copies portions of each block of data between the frame markers to form a collected blocks of data. The collected block is then inserted into the stream of blocks of data between the multiple adjacent blocks and is processed as described above in connection to regular block of block of data. The adjacent blocks are unaltered, but the portions that were book ends of the collected block are ignored when processing frames of data.

Once frame boundaries are found, it is possible to implement a frequency lock loop (FLL) function (or FLL) within block 1430. The FLL compares the phase difference between two adjacent frame markers by running (calculating the phase as) arctan(A*conj(B))/(2*pi)*FR, where A is the IQ value of the previous collapsed frame marker, B is the IQ value of the current collapsed frame marker and FR is the update rate of frame marker. The phase represents a frequency difference between the two frames which can then be fed into a second order FLL to find Doppler and Doppler Rate of the signal. The frequency estimate can be extremely accurate because the frame markers are separated by many symbols but the exact frequency may be in a non-zero Nyquist zone because the update rate of this calculation is small for the same reason. There are two ways to solve the Nyquist zone ambiguity. 1) Take advantage of waveform properties or 2) Collect several frames of data. For option 1, some waveforms like DVB-S2, allow for transmission of pilots within the frames to improve the frequency estimation in order to find the appropriate Nyquist zone. In the case of DVB-S2, a fine frequency estimator and Pilot-aided linear interpolation can be employed. For option 2, if the waveform does not have a useable frequency aid built it, it is possible to collect several frames of data of the same modulation type and run a carrier collapse algorithm, like to the method described in connection with FIG. 17 below. In this case, the Doppler Rate can be provided by the FLL so the calculation is simplified. In either case, once the Nyquist zone is known, the frequency estimate can simply be offset by the amount of the Nyquist zone and processing can continue. It is possible to add a PLL after the FLL to further enhance tracking and provide an improved phase, Doppler and Doppler estimate to block 1420.

Once frame boundaries are located, the frames are synchronized at block 1430 and output as frames of time corrected symbols. The processor 202 can perform carrier recovery error calculation block 1420 and carrier recovery block 1425 on received frames of time corrected symbols. The block 1420 and block 1425 are similar to and perform similar functions as blocks 520 and 525 (FIG. 5), respectively. An example of the carrier recovery error calculation 1420 is described in connection with FIG. 8 above.

As described above, blocks 1420 and 1425 may each represent a function and may be implemented as one or more of the function 306*a*, 306*b*, . . . 306*n* (FIG. 3). For example, in an illustrative example, the block 1420 may be implemented as function 306 of FIG. 3, such input samples may be split into frames of data, each assigned to a function 306*a*-306*n*, and processed in parallel functions 306*a*-306*n*. Similarly, block 1425 may be implemented as separate functions 306 and each executed as a plurality of functions 306*a*-306*n* to process a plurality of blocks of data in parallel.

In another example, alone or in combination, blocks 1420 and 1425 may be grouped together as a single "process" 1417 that perform functions in a similar manner to the process 315 of FIG. 4. That is, blocks 1420 and 1425 may be grouped together as process 1417 and executed in multiple, parallel iterations as processing blocks 1417*a* . . . 1417*n*. For example, the blocks 1420 and 1420 can be grouped together as a process 1417 and run in series-parallel and/or parallel-series processing as described above in connection to FIG. 4. In the illustrative example shown in FIG. 14, with reference to FIG. 4, the input samples may be ingested at block 305, split into frames of samples at block 310, each frame assigned to a processing block 1417*a*-1417*n*, and each frame of samples may be processed in multiple, parallel iterations of process 1415 as processing blocks 1417*a*-1417*n*. The processed frames of data are then output to the data combine 320 for combining the processed data and then output by block 325 for processing by a subsequent block of method 1400.

As described above, once frames boundaries have been located at block 1430, the phase can be detected using a phase detector (e.g., block 805 of FIG. 8). Each frame of data can have a different modulation type and the phase detector must be able to accommodate all possible modulation types. Additionally, for each modulation type, a different phase detector calculation may be used, which impacts how the carrier phase information is calculated. Thus, unlike in the case of overlapping data, the carrier recovery error calculation 1420, with reference to FIG. 8, raises incoming signal power based on the modulation type for a respective input frame of data, which varies for each frame of data on the of incoming signal. The modulation type may be provided by block 1430, for example, as metadata included with the output symbols, because the detected frame maker may include this information. Carrier recovery error calculation block 1420 can raise the incoming to certain power based on modulation type indicated in the metadata, for example, as described at block 805 of FIG. 8. Then blocks 810-830 of of method 800 are performed in a manner the substantially the same as set forth above.

In some embodiments disclosed herein, in the case of QPSK waveforms, since the PLL function (e.g., block 820 of FIG. 8 as executed at block 1420 of FIG. 14) is executed after collapsing the IQ constellation into a single tone (e.g., as performed at block 805 of FIG. 8), ambiguity of the carrier recovery may exist in terms of proper phase alignment of the signal. For example, if the modulation type of a given frame of data is QPSK, the PLL function could start at 4 different phase possibilities and only one is the proper alignment. In the case of framed waveforms, it is possible to use the frame marker to properly phase align the frame. This maybe be accomplished by calculating the frame marker phase and using this information to pre-seed the PLL function such that the PLL function starts with the phase ambiguity removed or correct the phase information output from the PLL function before performing carrier recovery (e.g., block 1425) (referred to herein as Post-Correct). In the case of DVB-S2 and Post-Correct, the frame marker can have 4 different phase ambiguity values and therefore the phase output of the PLL function is scaled by four different phase values: $0$, $\pi/4$, $\pi/2$ or $\pi*3/4$.

Block 1425 outputs phase and timing corrected symbols for downstream processing by one or more operations, which out bits corresponding to the received downlink signal. For example, operations may include, but not limited to, frame decoding, forward error correction, descrambling, deinterleaving, de-randomization, etc. Each operation is illustratively shown in FIG. 14 as operation blocks 1440a-1440n that processor 202 (e.g., one or more of the cores 204) may execute.

As described above, blocks 1440a-1440n may each represent a function and may be implemented as one or more of the function 306a, 306b, . . . 306n (FIG. 3). For example, in an illustrative example, the block 1440a may be implemented as function 306 of FIG. 3, such input samples may be split into blocks of data and processed in parallel functions 306a-306n.

In another example, alone or in combination, blocks 1440a-1440n may be grouped together as a single "process" 1419 that perform functions in a similar manner to the process 315 of FIG. 4. That is, one or more of blocks 1440a-1440n may be grouped together as process 1419 and executed in multiple, parallel iterations as processing blocks 1419a . . . 1419n. For example, as shown in the illustrative example of FIG. 14, the blocks 1440a-1440n can be grouped together as a process 1419 and run in series-parallel and/or parallel-series processing as described above in connection to FIG. 4. With reference to FIG. 4, the input samples may be ingested at block 305, split into a plurality of frames of samples at block 310, and each frame of samples may be processed in multiple, parallel iterations of process 1419 as processing blocks 1419a-1419n. The processed frames of data are then output to the data combine 320 for combining the processed data and then output by block 325 and output as bits.

While FIG. 14 depicts all of blocks 1440a-1440n grouped into process 1419, embodiments herein are not limited to such implementations. For example, subsets of blocks 1440a-1440n maybe grouped into a plurality of processes.

In various examples, the plurality of blocks of FIG. 14 may be implemented using SIMD processing techniques as described throughout the present disclosure. SIMD techniques may offer increased throughput and minimized memory bandwidth requirements. Increasing the functionality of each processing block executed using SIMD techniques may serve to provide increased minimization of memory bandwidth requirements.

In some implementations, another method for improvement is to vary the loop bandwidth required to execute the PLL function for each pass or iteration. Varying the loop bandwidth usage may allow for faster pull-in times to improve initial Doppler and Doppler Rate Estimation (e.g., from a carrier and frame acquisition techniques described in connection with FIG. 15).

In some implementations, as described above, the PLL function disclosed herein can be run over the data in the forward direction and backward direction as many times as needed. The more iterations executed, the smaller the error from the initial loop response as well as tracking issues introduced by having improper Doppler and Doppler Rate estimations of the PLL function. For example, in the case of carrier recovery, the PLL function may be ran forward and backward once on data (e.g., a single RPLL), then functions executed to compute and compensate for Doppler and Doppler rate (e.g., at the fine Doppler and Doppler rate estimator 1124 of FIG. 11). Once compensated, the RPLL may be reran, this time going forward and backward for two or more iterations (e.g., an RIPLL), then compute and compensate for Doppler and Doppler rate, and run the RPLL again. This process may be executed as many times as needed, all while changing loop bandwidths requirements of the loop to improve performance.

There are many techniques for carrier and frame acquisition, and embodiments herein provide for executing such techniques using multiple CPUs and/and SIMD instructions.

FIG. 15 is a functional block diagram of an embodiment of a method for carrier and frame acquisition of a received downlink signal, in accordance with embodiments disclosed herein. FIG. 15 illustrates method 1500, which may execute one or more carrier and frame acquisition techniques according to the methods for signal processing of FIG. 3 and/or FIG. 4. FIG. 15 illustrates a method 1500 that can be used for standard waveform processing as opposed to offset waveforms, as described above. In various examples, the method 15 may be implemented using SIMD processing techniques as described throughout the present disclosure. SIMD techniques may offer increased throughput and minimized memory bandwidth requirements. Increasing the functionality of each processing block executed using SIMD techniques may serve to provide increased minimization of memory bandwidth requirements.

Method 1500 comprises a plurality of blocks, one or more of which may be implemented as a process 315 such that the groupings of blocks are processed in each of processing blocks 315a-315n of FIG. 4. Each of the blocks of method 1500 may also each be implemented as a function 306 such that a single block can be executed across functions 306a-306n of FIG. 3. Execution of a block according to FIG. 3 may be performed separately or in combination with execution of a process according to FIG. 4.

Method 1500 comprises process 1515 where processor 202 (e.g., one or more of the cores 204) can perform timing recovery error calculation block 1505 and timing recovery block 1510 on received data packets (e.g., samples of the digitized bit stream 154 or the digitized downlink signal 160 and/or 170 received by receiver 212). The block 1505 and block 1510 are similar to and perform similar functions as blocks 1405 and 1410 (FIG. 14), respectively.

As described above, blocks 1505 and 1510 may each represent a function and may be implemented as one or more of the functions 306a, 306b, . . . 306n (FIG. 3). Similarly, alone or in combination, blocks 1505 and 1510 may be grouped together as a single "process" 1515 that perform functions in a similar manner to the process 315 of FIG. 4. That is, blocks 1505 and 1510 may be grouped together as process 1515 and executed in multiple, parallel iterations as processing blocks 1515a . . . 1515n, for example, as described above in connection to process 1415.

At block 1506 processor 202 (e.g., one or more of the cores 204) can perform carrier and frame acquisition on the output from process 1515. Similar to embodiments described above, block 1506 may represent a function and may be implemented as one or more of the function 306a, 306b, . . . 306n (FIG. 3). For example, in an illustrative example, the carrier and frame acquisition may be implemented as function block 1506, such input symbols may be split into blocks of data and processed in parallel functions 1506a-1506n.

For carrier acquisition, many approaches could be utilized. For example, frequency domain analysis, differential phase calculation (e.g., mean(x[n]*conj(x[n−m]), when n is the block of data and m is the amount of delay) in the sample domain, and the alike. It is also possible to estimate carrier frequency information after timing recovery, as illustrated in FIG. 15. For framed data, it is also possible to correlate frames based on detecting a frame marker, as described above.

In the illustrative example of FIG. 15, once timing recovery is performed at process 1515, the frame of data is copied and sent to many a plurality of functions 1506a-1506n as shown in FIG. 15. Each function block correlates in a narrow frequency band and by using an increased number functional blocks and acquisition time is reduced. Since carrier frequency estimation and frame boundary identification is computationally expensive, the more CPU cores (e.g., cores 204 each executing a function 1506a-1506n) that can be used, the better. For example, if the frequency uncertainty range of received signal is +/−1 MHz, and each function 1506 can cover +/−100 kHz, it is possible to use 10 CPU cores to search over the entire frequency range at once. Using SIMD techniques further improves acquisition time.

While FIG. 15 illustrates both timing recovery blocks and carrier and frame acquisition blocks, embodiments described above may receive carrier and frame estimations via process 1506 (e.g., block 520 execute in functions 1506a-1506n). For example, as described in connection to FIG. 720, carrier and frame acquisition (such as those performed in block 1506) may be used to pre-seed a PLL function. In these cases, timing recovery in process 1515 may not be required for pre-seeding. As another example, the function 1506 may be implemented as part of the estimator 1105 of FIG. 15 or to estimate carrier at block 810 of FIG. 8.

FIGS. 16 and 17 are functional block diagram of example methods for carrier frequency acquisition, in accordance with embodiments disclosed herein. FIG. 16 illustrates method 1600 which is an example method for carrier frequency acquisition that may be implemented on framed data (or data where the modulation type is unknown or variable) at block 1520 of FIG. 15. FIG. 17 illustrates system and method 1700 which is another example method for carrier frequency acquisition that may be implemented on unframed data (or data where the modulation type is known or static between adjacent blocks for data) at block 1520 of FIG. 15. While method 1700 may be implemented on unframed data, it will be appreciated that method 1700 may be applied to framed data as well, but that method 1600 may be better suited for such data. While FIGS. 16 and 17 illustrate specific examples of methods for carrier frequency acquisition at block 1520, it will be appreciated that the embodiments of block 1520 are not limited to only methods 1600 and 1700. Block 1520 may be implemented as any known method for estimating a carrier frequency of streaming blocks of data packets. Methods 1600 and 1700 are used as illustrative examples.

Similar to embodiments described above, method 1600 may represent a function and may be implemented as one or more of the functions 306a, 306b, . . . 306n (FIG. 3). For example, in an illustrative example, the carrier and frame acquisition method 1600 may be implemented as function block 1506 of FIG. 15, such input symbols may be split into blocks of data and processed in parallel functions 1506a-1506n. Similarly, method 1700 may represent a function and may be implemented as function block 1506 of FIG. 15.

Turning first to method 1600, the illustrative example of method 1600 comprises a plurality of sub-function blocks, including but not limited to, frequency trial calculator function block 1605, mix by coarse carrier estimate function block 1610, start-of-frame (SOF) detector function block 1615, frame marker detector function block 1620, and frame marker collapse and frequency detector function block 1625.

In some embodiments, in addition to finding the frame markers, method 1600 may also perform a coarse frequency and tracking of the received time-corrected symbols. Coarse frequency acquisition may be performed by detecting the start-of-frame (SOF) in several different frequency trial bins. For example, at sub-function block 1605, as described above, the processor 202 receives time-corrected symbols, including one or more frame markers attached to thereto (e.g., as metadata) (e.g., as output from a timing recovery process, such as those described in connection with FIGS. 14 and 15) and calculates different frequency trial bins. SOF detection may only work for a limited frequency range and if the carrier frequency uncertainty (CFU) is greater than that the frequency range, the CFU is broken in to a number of frequency trials bins so that each trial is only covering the SOF frequency detection range.

At block 1610, the frequency trial bins are mixed by a coarse carrier frequency provided, for example, by a Diff Conjugate calculation. From the mixed signal, block 1615 detects a SOF, for each frequency trial bin, to identify a possible candidate frame markers indicating a beginning of a frame. Once possible candidate frame markers are found, all frame marker possibilities are correlated against the candidate frame marker and if the correlation result is strong enough then the frame marker of the start of the frame is detected from the correlation (block 1620).

Once the frame marker is found, block 1625 further refines the frequency estimation by collapsing the frame marker (for example, 90 symbols in length) into a carrier wave. For example, at block 1625, the processor 202 takes an FFT of the symbols of each frame, and calculates a frequency offset. Frequency tracking may be performed by comparing the phase difference between two sequential collapsed frame, as is known in the art. Block 1625 then outputs Doppler, Doppler Rate, and frame boundary information (e.g., as metadata attached to each frame of symbols).

FIG. 17 illustrates another example carrier frequency acquisition method 1700. The illustrative example of method 1700 comprises a plurality of sub-function blocks, including but not limited to, Raise to N Power function block 1705, Mix by Coarse Carrier Estimate function block 1710, Decimate function block 1715, FFT Trials function block 1720, and Peak Detection function block 1725.

At sub-function block 1005, the symbols are input into carrier frequency acquisition block 1700 and raised to the appropriate power based on the number of symbols (N) in the outer ring of the constellation (2 for BPSK, 4 for QPSK/OQPSK, 8 for 8PSK, 12 for 16APSK, etc.) at block 1705 and then mixed by coarse carrier frequency provided by Diff Conjugate calculation (if provided) at the sub-function block 1710. The mixed signal is then decimated at sub-function block 1715 and an FFT is performed on the signal at sub-function block 1720 to determine the peak-to-average ratio for the chosen modulation type at sub-function block 1725. This process is then repeated for all of the desired modulation types to be detected. The result with the highest peak-to-average is the most likely modulation type. As a way to minimize memory bandwidth the sub-function block 1705, sub-function block 1710 and sub-function block 1715 may be combined to form one sub-function block, which may decrease memory bandwidth. In order to further increase data rates, it is possible to run each modulation type trial at sub-function block 1720 on its own thread to further increase throughput.

The accompanying claims and their equivalents are intended to cover such forms or modifications as would fall within the scope of the disclosure. The various components illustrated in the figures may be implemented as, for example, but not limited to, software and/or firmware on a processor or dedicated hardware. Also, the features and attributes of the specific example embodiments disclosed above may be combined in different ways to form additional embodiments, all of which fall within the scope of the disclosure.

The foregoing method descriptions and the process flow diagrams are provided merely as illustrative examples and are not intended to require or imply that the operations of the various embodiments must be performed in the order presented. As will be appreciated by one of skill in the art, the order of operations in the foregoing embodiments may be performed in any order. Words such as "thereafter," "then," "next," etc., are not intended to limit the order of the operations; these words are simply used to guide the reader through the description of the methods. Further, any reference to claim elements in the singular, for example, using the articles "a," "an," or "the" is not to be construed as limiting the element to the singular.

The various illustrative logical blocks, modules, and algorithm operations described in connection with the embodiments disclosed herein may be implemented as electronic hardware, computer software, or combinations of both. To clearly illustrate this interchangeability of hardware and software, various illustrative components, blocks, modules, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present inventive concept.

The hardware used to implement the various illustrative logics, logical blocks, and modules described in connection with the various embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary embodiments, the functions described may be implemented in hardware, software, firmware, or any combination thereof. If implemented in software, the functions may be stored as one or more instructions or codes on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media.

Additionally, the operations of a method or algorithm may reside as one or any combination or set of codes and/or instructions on a non-transitory processor-readable storage medium and/or computer-readable storage medium, which may be incorporated into a computer program product.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects.

Thus, the claims are not intended to be limited to the aspects shown herein, but are to be accorded the full scope consistent with the language claims, wherein reference to an element in the singular is not intended to mean "one and only one" unless specifically so stated, but rather "one or more."

The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more.

What is claimed is:

1. A method for processing a digital bit stream, wherein the digital bit stream is a digitized communication signal, the method comprising:

dividing, at one or more processors, the digital bit stream into a plurality of data packets;
in a first processing block of the one or more processors, performing a carrier recovery error calculation on a first portion of the plurality of data packets, comprising preforming a first phase locked loop (PLL) function on decimated data of the first portion of the plurality of data packets, and
performing a carrier recovery operation on the first portion of the plurality of data packets;
in a second processing block of the one or more processors, in parallel with the process of performing the carrier recovery error calculation and the carrier recovery operation on the first portion of the plurality of data packets,
performing the carrier recovery error calculation on a second portion of the plurality of data packets, comprising preforming the first PLL function on decimated data of the second portion of the plurality of data packets, and
performing the carrier recovery operation on the second portion of the plurality of data packets; and
combining the first portion of the plurality of data packets and the second portion of the plurality of data packets based on phase stitching.

2. The method of claim 1, further comprising:
in a third processing block of the one or more processors, performing a timing recovery error calculation on the first portion of the plurality of data packets, and
performing a timing recovery operation on the first portion of the plurality of data packets; and
in a fourth processing block of the one or more processors, in parallel with the process of performing the timing recovery error calculation and the timing recovery operation on the first portion of the plurality of data packets,
performing the timing recovery error calculation on the second portion of the plurality of data packets, and
performing the timing recovery operation on the second portion of the plurality of data packets.

3. The method of claim 2, wherein performing the timing recovery error calculation on the first portion of the plurality of data packets and on the second portion of the plurality of data packets comprises preforming a second PLL function on the decimated data of the first and second portions of the plurality of data packets.

4. The method of claim 2, wherein performing the timing recovery error calculation on the first portion of the plurality of data packets and on the second portion of the plurality of data packets comprises:
receiving the plurality of data packets as samples of a downlink signal, the samples having an unknown symbol rate and frequency;
determining a timing error of the samples based on an estimate of the unknown symbol rate;
decimating the samples by a decimation filter;
executing a second PLL function on the decimated data of the first and second portions of the plurality of data packets to determine a phase, frequency, and Doppler rate of the samples; and
updating the estimate of the unknown symbol rate.

5. The method of claim 4, wherein each of the plurality of data packets includes an overlap of data from an adjacent data packet, and wherein the second PLL function is a second order PLL.

6. The method of claim 4, wherein the plurality of data packets are framed data packets, and wherein the second PLL function is one of a reversable PLL and a reversable, iterative PLL.

7. The method of claim 4, wherein performing the carrier recovery error calculation on the first portion of the plurality of data packets and on the second portion of the plurality of data packets comprises:
receiving the samples associated with synchronized samples of the downlink signal;
determining a carrier error of the samples based on an estimate of a frequency of the downlink signal and a product of the samples raised to a power of n, wherein n is an integer;
decimating the samples by the decimation filter;
executing the first PLL function on the decimated samples to determine a phase, frequency, and Doppler rate of the samples; and
updating the estimate of the frequency of the downlink signal.

8. The method of claim 2, further comprising:
combining the output of the third processing block and the output of the fourth processing block into blocks of time corrected symbols; and
locating frame boundaries of the blocks of time corrected symbols by detecting a frame marker,
wherein performing the carrier recovery error calculation on the first and second portions of the plurality of data packets is based on the located frame boundaries.

9. The method of claim 1, wherein the first PLL function is one of a second order PLL, a third order PLL, a reversable PLL, and a reversable, iterative PLL.

10. The method of claim 1, wherein the first processing block and the second processing block comprise a plurality of central processing unit (CPU) cores.

11. The method of claim 1, wherein the one or more processors employ single instructions, multiple data (SIMD) techniques to achieve high throughput.

12. The method of claim 1, wherein the one or more processors are one or more general-purpose central processing units (CPUs), the first processing block comprises a first one or more CPU cores of the one or more general-purpose CPUs, and the second processing block comprises a second one or more CPU cores of the one or more general-purpose CPUs.

13. A method for processing a digital bit stream, wherein the digital bit stream is a frame based digitized communication signal, the method comprising:
dividing, at one or more processors, the digital bit stream into a plurality of data packets;
in a first processing block of the one or more processors, performing a timing recovery error calculation on a first portion of the plurality of data packets, comprising preforming a first phase locked loop (PLL) function on decimated data of the first portion of the plurality of data packets, and
performing a timing recovery operation on the first portion of the plurality of data packets;
in a second processing block of the one or more processors, in parallel with the process of performing the timing recovery error calculation and the timing recovery operation on the first portion of the plurality of data packets,
performing the timing recovery error calculation on a second portion of the plurality of data packets, comprising preforming the first PLL function on decimated data of the second portion of the plurality of data packets, and performing the timing recovery operation on the second portion of the plurality of data packets;

combining the output of the first processing block and the output of the second processing block into combined processing blocks of time corrected symbols including one or more frame markers;

searching the combined processing blocks of the time corrected symbols for the one or more frame markers included with each combined processing block of the time corrected symbols;

executing a correlator process and a frequency tracking process to locate frame boundaries and track a carrier frequency; and outputting frames of the time corrected symbols.

14. The method of claim 13, wherein executing the correlator process and the frequency tracking process comprises:

performing a frequency lock loop (FLL) function to compare a phase difference between two adjacent frame markers.

15. The method of claim 14, wherein performing the FLL function to compare the phase difference between the two adjacent frame markers comprises calculating arctan(A*conj(B))/(2*pi)*FR to obtain a calculated value, where A is an IQ value of a previous collapsed frame marker, B is an IQ value of a current collapsed frame marker and FR is an update rate of a frame marker.

16. The method of claim 15, further comprising dividing, at the one or more processors, the frames of the time corrected symbols into a plurality of time corrected symbols;

in a third processing block of the one or more processors, performing a carrier recovery error calculation on the first portion of the plurality of data packets, comprising preforming a second phase locked loop PLL function on decimated data of a first portion of the plurality of time corrected symbols, and performing a carrier recovery operation on the first portion of the plurality of time corrected symbols;

in a fourth processing block of the one or more processors, in parallel with the process of performing the carrier recovery error calculation on the first portion of the plurality of data packets and performing the carrier recovery operation on the first portion of the plurality of time corrected symbols, performing the carrier recovery error calculation on a second portion of the plurality of time corrected symbols, comprising preforming the second PLL function on decimated data of the second portion of the plurality of time corrected symbols, and performing the carrier recovery operation on the second portion of the plurality of time corrected symbols; and combining the first portion of the plurality of time corrected symbols and the second portion of the plurality of time corrected symbols based on phase stitching.

17. The method of claim 16, further comprising adding the second PLL function after the FLL function to enhance tracking and provide an improved phase, Doppler and Doppler estimate for the carrier recovery error calculation.

18. The method of claim 13, wherein the one or more processors are one or more general-purpose central processing units (CPUs), the first processing block comprises a first one or more CPU cores of the one or more general-purpose CPUs, and the second processing block comprises a second one or more CPU cores of the one or more general-purpose CPUs.

19. A method for processing a digital bit stream, wherein the digital bit stream is a frame based digitized communication signal, the method comprising:

dividing, at one or more processors, the digital bit stream into a plurality of data packets;

in a first processing block of the one or more processors, performing a timing recovery error calculation on a first portion of the plurality of data packets, comprising preforming a first phase locked loop (PLL) function on decimated data of the first portion of the plurality of data packets, and performing a timing recovery operation on the first portion of the plurality of data packets; and in a second processing block of the one or more processors, in parallel with the process of performing the timing recovery error calculation and the timing recovery operation on of the first portion on the plurality of data packets, performing the timing recovery error calculation on a second portion of the plurality of data packets, comprising preforming the first PLL function on decimated data of the second portion of the plurality of data packets, and performing the timing recovery operation on the second portion of the plurality of data packets.

20. The method of claim 19, further comprising:

combining the output of the first processing block and the output of the second processing block into combined processing blocks of time corrected symbols including one or more frame markers; and locating frame boundaries of each of the combined processing blocks of the time corrected symbols by detecting a frame marker.

21. The method of claim 20, wherein locating the frame boundaries includes:

executing a correlator process and a frequency tracking process to locate the frame boundaries and track a carrier frequency; and outputting frames of the time corrected symbols.

22. A system for processing the digital bit stream representative of the frame based digitized communication signal, the system comprising:

a digitizer configured to convert a received analog signal into the digital bit stream; and the one or more processors communicatively coupled to the digitizer, the one or more processors including the first processing block and the second processing block and configured to perform the method of claim 19.

23. The method of claim 19, wherein the one or more processors are one or more general-purpose central processing units (CPUs), the first processing block comprises a first one or more CPU cores of the one or more general-purpose CPUs, and the second processing block comprises a second one or more CPU cores of the one or more general-purpose CPUs.

* * * * *